(12) United States Patent
Lu et al.

(10) Patent No.: US 12,165,923 B2
(45) Date of Patent: Dec. 10, 2024

(54) METHOD OF MANUFACTURING A SEMICONDUCTOR DEVICE

(71) Applicant: TAIWAN SEMICONDUCTOR MANUFACTURING COMPANY, LTD., Hsinchu (TW)

(72) Inventors: Chuan-Hui Lu, Hsinchu (TW); Ming-Feng Shieh, Yongkang (TW); Ming-Jhih Kuo, Zhubei (TW); Ming-Wen Hsiao, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 708 days.

(21) Appl. No.: 17/352,069

(22) Filed: Jun. 18, 2021

(65) Prior Publication Data

US 2022/0406661 A1    Dec. 22, 2022

(51) Int. Cl.
*H01L 21/8234* (2006.01)
*H01L 21/033* (2006.01)
*H01L 21/308* (2006.01)

(52) U.S. Cl.
CPC .. *H01L 21/823418* (2013.01); *H01L 21/0337* (2013.01); *H01L 21/3081* (2013.01); *H01L 21/823431* (2013.01); *H01L 21/823475* (2013.01)

(58) Field of Classification Search
None
See application file for complete search history.

(56) References Cited

U.S. PATENT DOCUMENTS

2016/0104646 A1*  4/2016  Hung ............... H01L 21/76816
                                                          438/666

* cited by examiner

*Primary Examiner* — Joseph C. Nicely
*Assistant Examiner* — Lamont B Koo
(74) *Attorney, Agent, or Firm* — STUDEBAKER & BRACKETT PC

(57) ABSTRACT

In a method of manufacturing a semiconductor device, underlying structures comprising gate electrodes and source/drain epitaxial layers are formed, one or more layers are formed over the underlying structures, a hard mask layer is formed over the one or more layers, a groove pattern is formed in the hard mask layer, one or more first resist layers are formed over the hard mask layer having the groove pattern, a first photo resist pattern is formed over the one or more first resist layers, the one or more first resist layers are patterned by using the first photo resist pattern as an etching mask, thereby forming a first hard mask pattern, and the hard mask layer with the groove pattern are patterned by using the first hard mask pattern, thereby forming a second hard mask pattern.

20 Claims, 18 Drawing Sheets

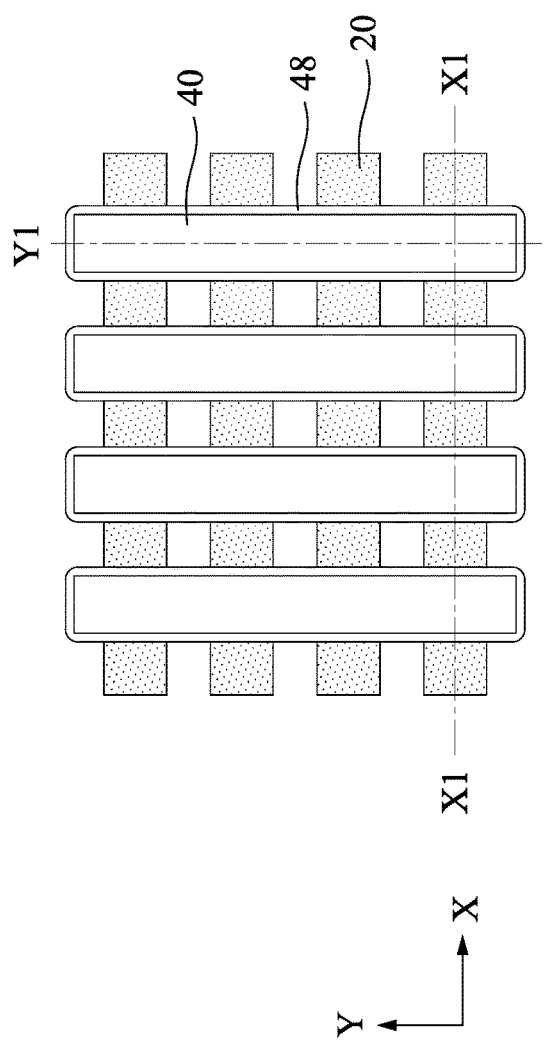
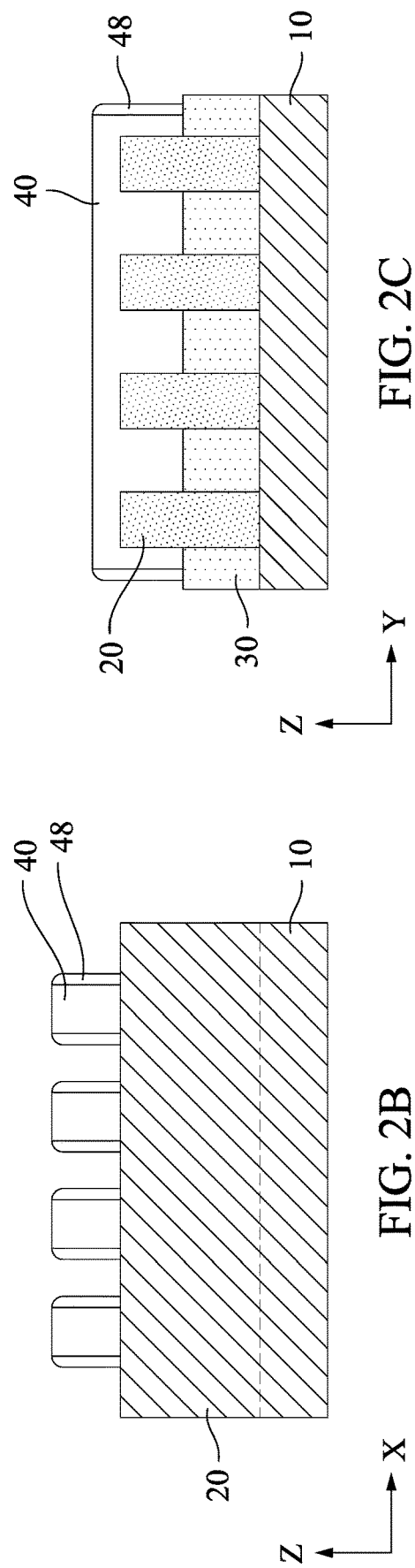
FIG. 2A
FIG. 2B
FIG. 2C

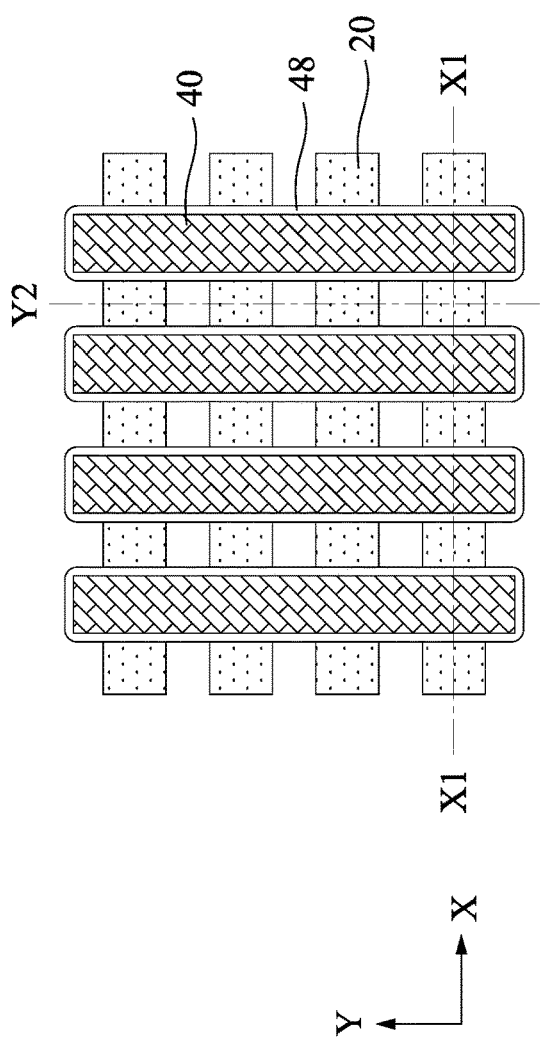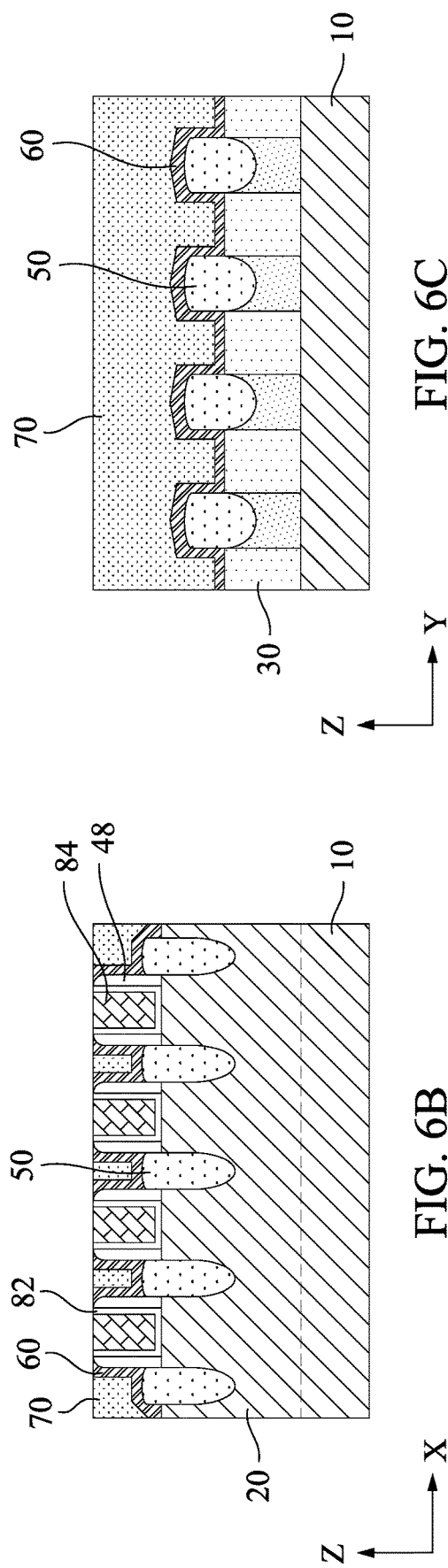

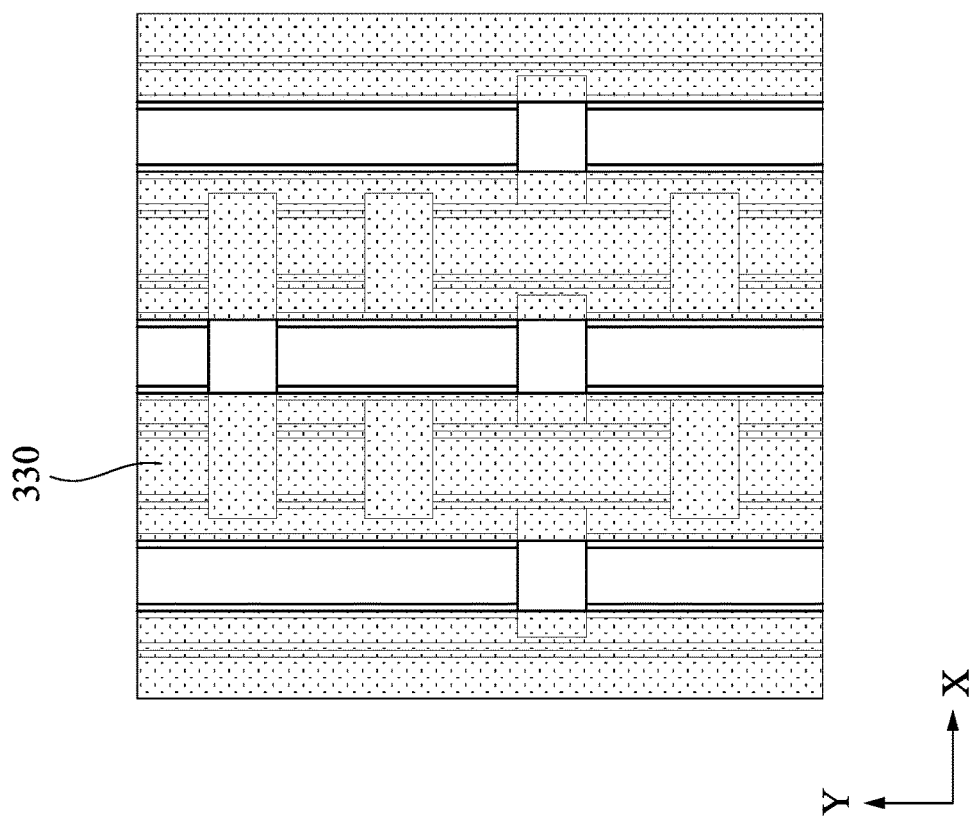
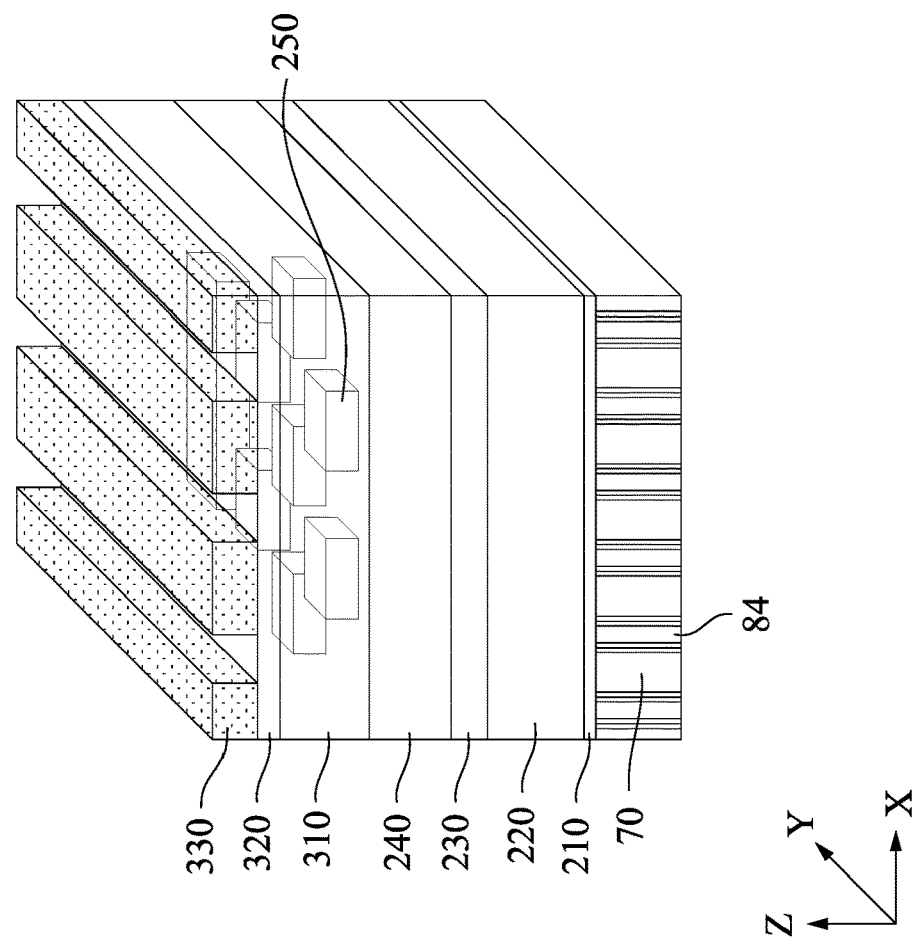
FIG. 9B
FIG. 9A

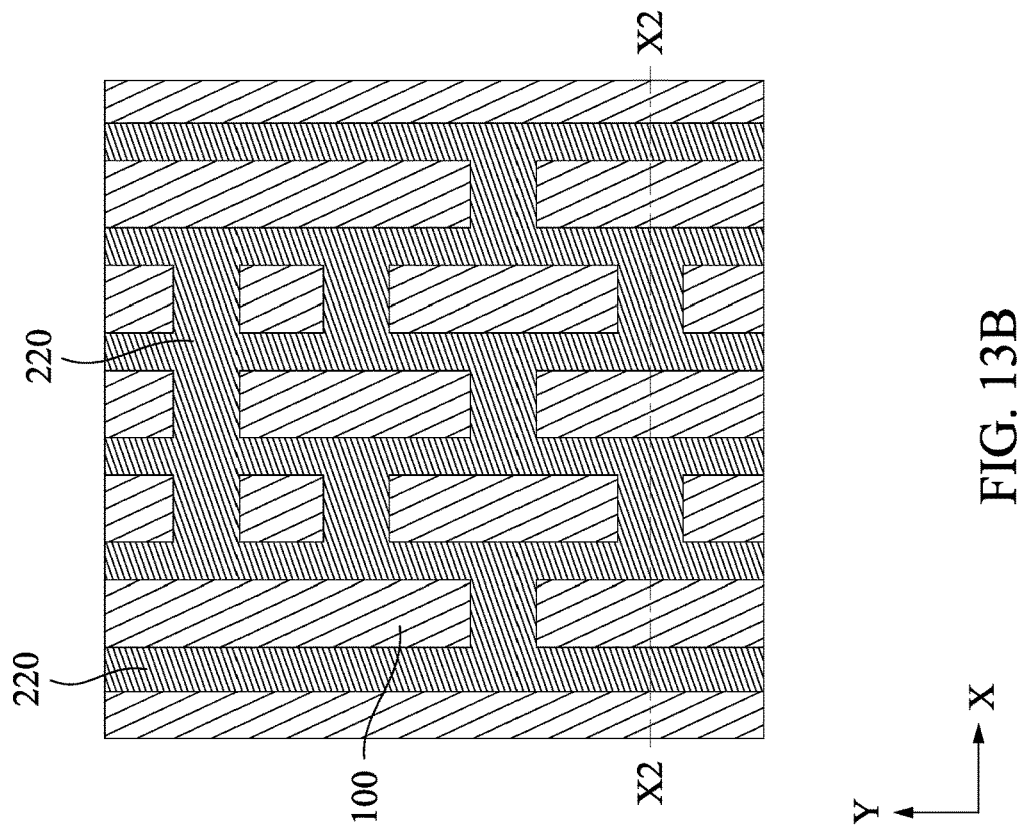
FIG. 13B
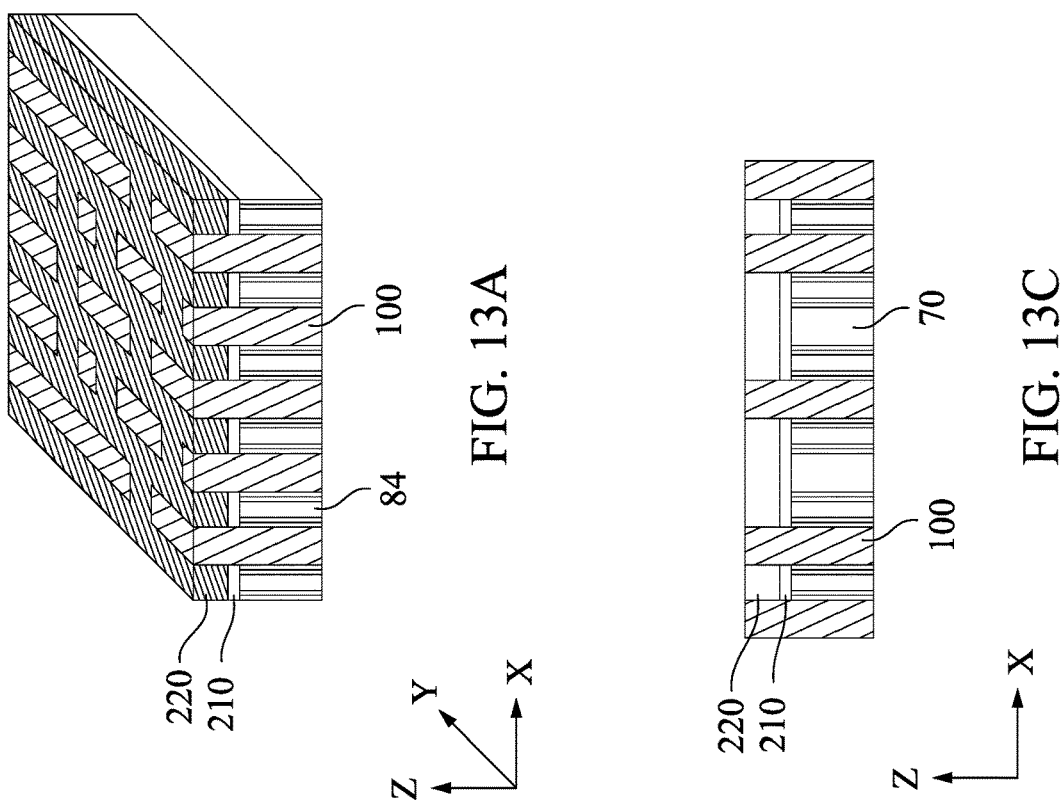
FIG. 13A
FIG. 13C

METHOD OF MANUFACTURING A SEMICONDUCTOR DEVICE

BACKGROUND

With a decrease of dimensions of semiconductor devices with a complex layout structure, a local interconnect that connects a source/drain region to another source/drain region has been developed. A local interconnect or a diffusion contact is a conductive layer disposed on a source/drain region (e.g., source/drain epitaxial layer) below the first metal wiring layer, and connects elements having a relatively short distance and to gain a height of the source/drain region to be electrically connected to the first metal wirings. In designing standard cells, local interconnects enhance design flexibility and minimize the size of the standard cells. It has been required to provide structures and manufacturing processes for a local interconnect for more design flexibility and higher reliability.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B and 2C show a plan view (a top view), a cross sectional view along the X direction and a cross sectional view along the Y direction, respectively, illustrating one of the stages of a sequential semiconductor device fabrication process according to an embodiment of the present disclosure.

FIGS. 6A, 6B and 6C show a plan view (a top view), a cross sectional view along the X direction and a cross sectional view along the Y direction, respectively, illustrating one of the stages of a sequential semiconductor device fabrication process according to an embodiment of the present disclosure.

FIGS. 9A and 9B show a perspective view and a plan view (a top view), respectively, illustrating one of the stages of a sequential semiconductor device fabrication process according to an embodiment of the present disclosure.

FIGS. 13A, 13B and 13C show a perspective view, a plan view (a top view) and a cross sectional view, respectively, illustrating one of the stages of a sequential semiconductor device fabrication process according to an embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations same as or similar to those described with one embodiment may be employed in the other embodiments and the detailed explanation may be omitted.

Figure 1:
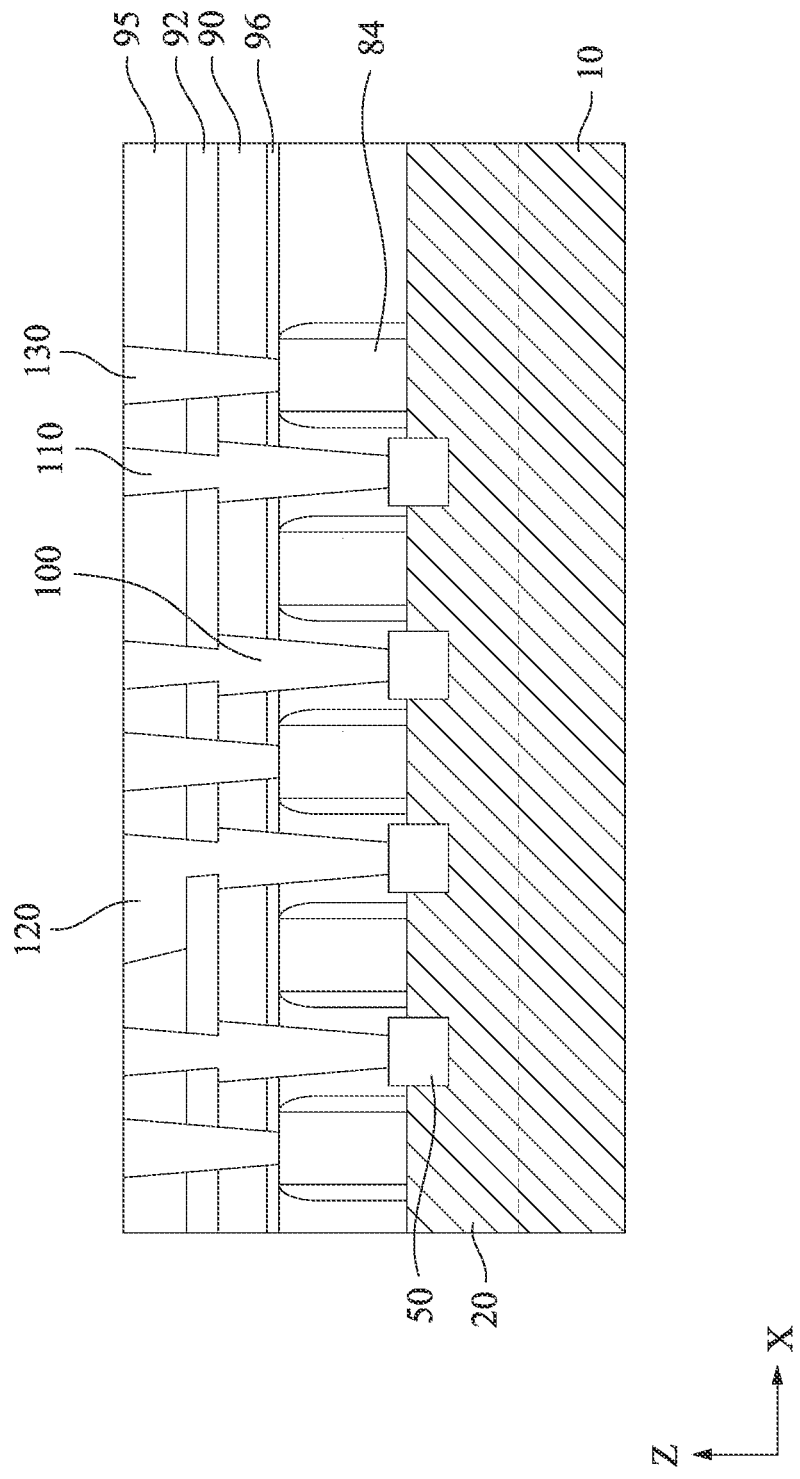
FIG. 1 shows a cross sectional view along the X direction of a semiconductor device according to an embodiment of the present disclosure.

FIG. 1 shows a cross sectional view along the X direction of a semiconductor device according to an embodiment of the present disclosure. A semiconductor device includes transistors disposed over a substrate 10, having a gate electrode 84 disposed over a channel region 20 and a source region and a drain region (source/drain region 50). The semiconductor device further includes one or more conductive wiring layers 120 formed in one or more interlayer dielectric layers 95. In some embodiments, the channel region 20 is a part of a fin structure protruding from an isolation insulating layer. A source/drain contact layer 100, which may also be referred to as a local interconnect or a diffusion contact, is a conductive (e.g., metal or metallic) layer disposed on a source/drain region 50 (e.g., source/drain epitaxial layer) below the first (lowest) metal wiring layer. The source/drain contact layer 100 is also used to increase the height of the source/drain regions electrically connected to the first metal wirings. In such a case, the source/drain contact layer 100 does not necessarily connect two or more source/drain regions, and is disposed on one source/drain region. A via 110 is further disposed on the source/drain contact layer and embedded an etch stop layer 96 and multiple dielectric layers 90, 92 and 95. A gate contact layer 130 is also disposed on the gate electrode 84.

In some embodiments, plurality of line-shaped conductive layers are formed between adjacent gate electrodes and a cutting operation is performed to cut the line-shaped conductive layers into multiple source/drain contact layers, by removing part of the line-shaped conductive layers. In other embodiments, a plurality of grooves corresponding to the source/drain contact layers are formed between adjacent gate electrodes, and the grooves are filled with conductive material.

FIGS. 2A to 13C show various views illustrating a sequential fabrication process for the source/drain contact layer 100 according to an embodiment of the present disclosure. In these figures, some layers/features are omitted for simplification. It is understood that additional operations can be provided before, during, and after processes shown below by these figures, and some of the operations described below can be replaced or eliminated, for additional embodiments of the method. The order of the operations/processes may be interchangeable.

FIGS. 2A-2C show one of the stages of a sequential fabrication process of a semiconductor device according to an embodiment of the present disclosure. FIG. 2A shows a plan (top) view, FIG. 2B shows a cross sectional view along line X1-X1 of FIG. 2A and FIG. 2C shows a cross sectional view along Y1-Y1 of FIG. 2A.

As shown in FIGS. 2A and 2B, fin structures 20, as active regions, are disposed over a substrate 10, and separated by an isolation insulating layer (shallow trench isolation (STI)) 30. In some embodiments, the fin structures 20 include one or more fin structures for n-type fin field effect transistor transistors (Fin FETs) and one or more fin structures for p-type Fin FETs. The substrate 10 is, for example, a p-type silicon substrate with an impurity concentration in a range from about $1 \times 10^{15}$ cm$^{-3}$ to about $1 \times 10^{18}$ cm$^{-3}$. In other embodiments, the substrate is an n-type silicon substrate with an impurity concentration in a range from about $1 \times 10^{15}$ cm$^{-3}$ to about $1 \times 10^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on insulator) substrate.

In some embodiments, the fin structures 20 are patterned by any suitable method. For example, the fin structures 20 can be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures.

The isolation insulating layer 30 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), a mixture of MSQ and HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. The flowable film may be doped with boron and/or phosphorous. The isolation insulating layer 30 may be formed by one or more layers of spin-on-glass (SOG), SiO, SiON, SiOCN and/or fluoride-doped silicate glass (FSG) in some embodiments. After forming a thick isolation insulating layer over the fin structures 20, a planarization operation is performed so as to remove part of the isolation insulating layer. The planarization operation may include a chemical mechanical polishing (CMP) and/or an etch-back process. Then, the isolation insulating layer is further removed so that an upper part of the fin structure 20, which is to become a channel layer, is exposed, as shown in FIG. 2C. In certain embodiments, the partial removing of the isolation insulating layer 30 is performed using a wet etching process, for example, by dipping the substrate in hydrofluoric acid (HF). In another embodiment, the partial removing of the isolation insulating layer 30 is performed using a dry etching process. For example, a dry etching process using $CHF_3$ or $BF_3$ as etching gases is used. After forming the isolation insulating layer 30, a thermal process, for example, an anneal process, is performed to improve the quality of the isolation insulating layer 30. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

Then, a dummy gate structure 40 is formed over part of the fin structures 20 as shown in FIGS. 2A-2C. A dielectric layer and a poly silicon layer are formed over the isolation insulating layer 30 and the exposed fin structures 20, and then patterning operations are performed so as to obtain a dummy gate structure including a dummy gate electrode layer made of poly silicon and a dummy gate dielectric layer. The patterning of the poly silicon layer is performed by using a hard mask including a silicon nitride layer and an oxide layer in some embodiments. The dummy gate dielectric layer can be silicon oxide formed by CVD, PVD, ALD, e-beam evaporation, or other suitable process. In some embodiments, the dummy gate dielectric layer includes one or more layers of silicon oxide, silicon nitride, silicon oxy-nitride, or high-k dielectrics. In some embodiments, a thickness of the dummy gate dielectric layer is in a range of about 1 nm to about 5 nm. In some embodiments, the dummy gate electrode layer is doped polysilicon with uniform or non-uniform doping. In the present embodiment, the width of the dummy gate electrode layer is in the range of about 30 nm to about 60 nm. In some embodiments, a thickness of the dummy gate electrode layer is in a range of about 30 nm to about 50 nm. In addition, one or more dummy gate structures may be disposed adjacent to both sides of the dummy gate structure 40 to improve pattern fidelity in patterning processes. The width of the dummy gate structure 40 is in a range of about 5 nm to about 40 nm in some embodiments, and is in a range of about 7 nm to about 15 nm in certain embodiments.

Further, as shown in FIGS. 2A-2C, sidewall spacers 48 are formed on opposite side faces of the dummy gate structures 40. An insulating material layer for sidewall spacers 48 is formed over the dummy gate structure 40. The insulating material layer is deposited in a conformal manner so that it is formed to have substantially equal thicknesses on vertical surfaces, such as the sidewalls, horizontal surfaces, and the top of the dummy gate structure 40, respectively. In some embodiments, the insulating material layer has a thickness in a range from about 5 nm to about 20 nm. The insulating material layer includes one or more of SiN, SiON and SiCN or any other suitable dielectric material. The insulating material layer can be formed by ALD or CVD, or any other suitable method. Next, bottom portions of the insulating material layer are removed by anisotropic etching, thereby forming sidewall spacers 48. In some embodiments, the sidewall spacers 46 include two to four layers of different insulating materials. In some embodiments, part of the dummy gate dielectric layer is disposed between the sidewall spacers 48 and the isolation insulating layer 30. In other embodiments, no part of the dummy gate dielectric layer is disposed between the sidewall spacers 46 and the isolation insulating layer 30.

In FIGS. 2A-2C, four fin structures 20 and four dummy gate structures are shown. However, the numbers of the fin structures 20 and the dummy gate structures are not limited to four, respectively.

Figure 3A:
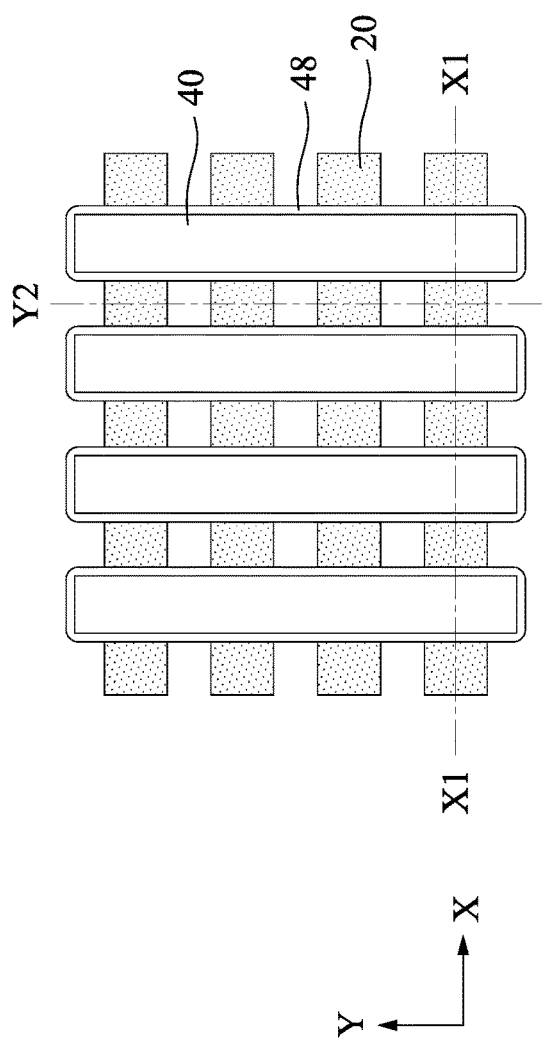
FIGS. 3A, 3B and 3C show a plan view (a top view), a cross sectional view along the X direction and a cross sectional view along the Y direction, respectively, illustrating one of the stages of a sequential semiconductor device fabrication process according to an embodiment of the present disclosure.
Figure 3C:
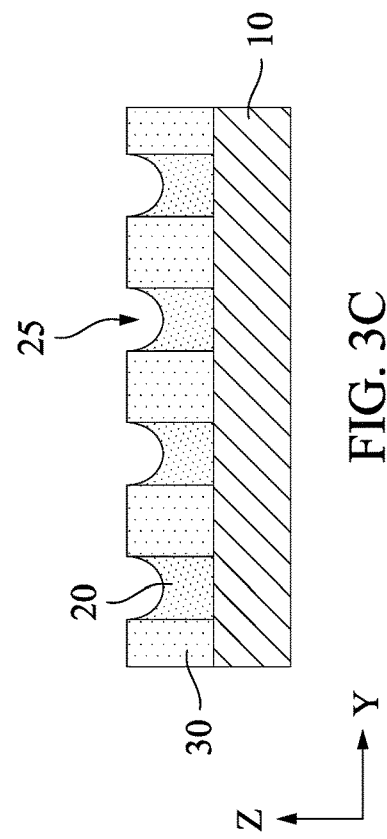
Figure 3B:
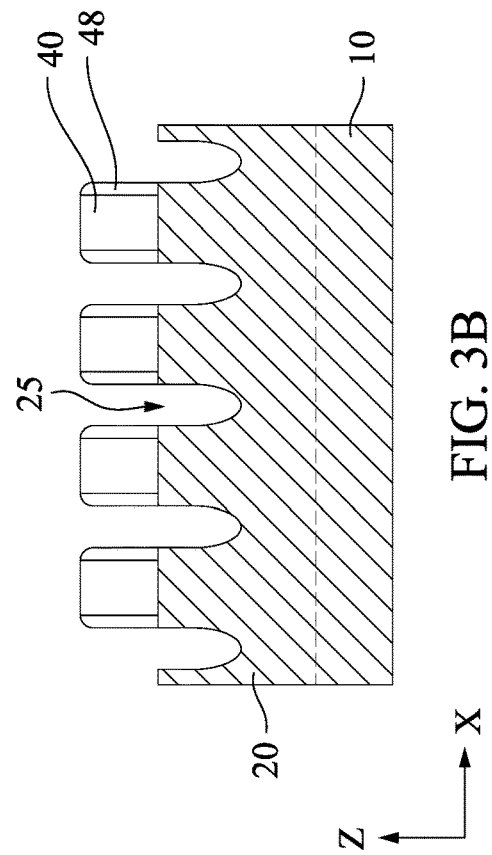

FIGS. 3A-3C show one of the stages of a sequential fabrication process of a semiconductor device according to an embodiment of the present disclosure. FIG. 3A shows a plan (top) view, FIG. 3B shows a cross sectional view along line X1-X1 of FIG. 3A and FIG. 3C shows a cross sectional view along Y2-Y2 of FIG. 3A.

Subsequently, a source/drain region of the fin structure 20 not covered by the dummy gate structure 40 is etched down (recessed) to form a source/drain recess 25 in some embodiments. In other embodiments, no recess is formed and the epitaxial layers are formed over the fin structure.

Figure 4A:
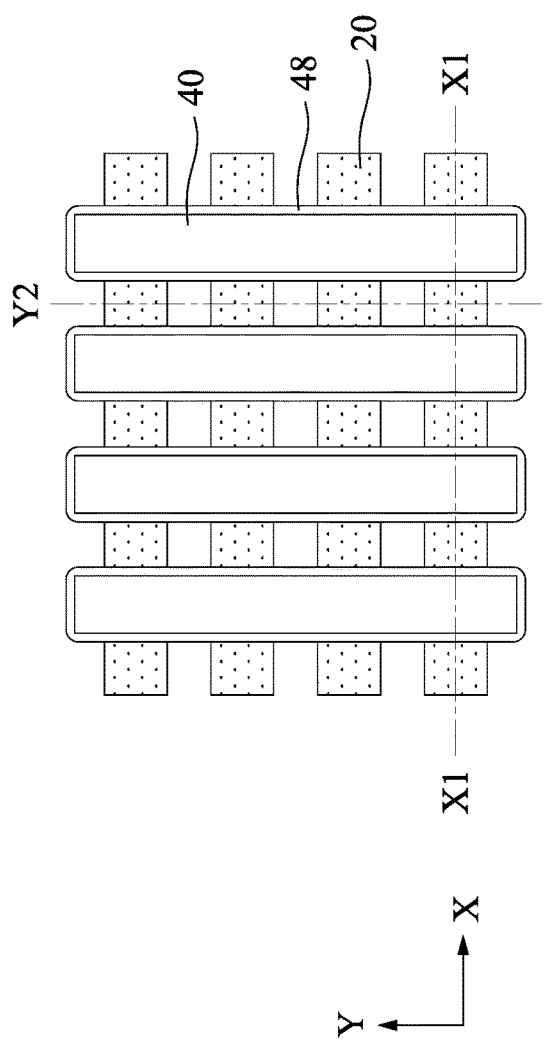
FIGS. 4A, 4B and 4C show a plan view (a top view), a cross sectional view along the X direction and a cross sectional view along the Y direction, respectively, illustrating one of the stages of a sequential semiconductor device fabrication process according to an embodiment of the present disclosure.
Figure 4C:
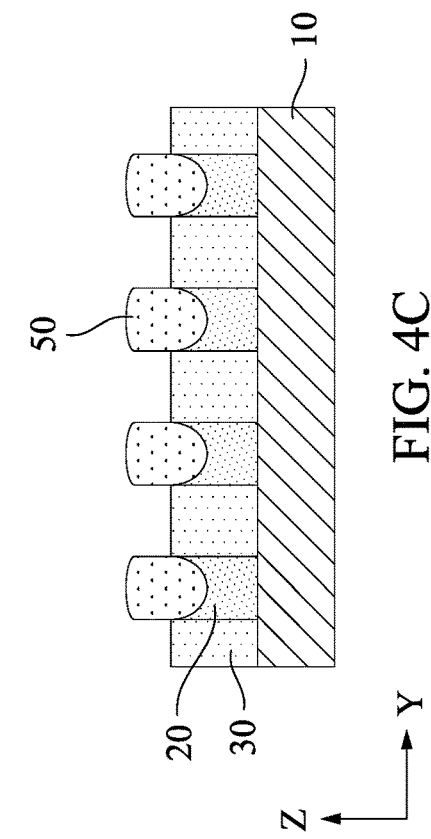
Figure 4B:
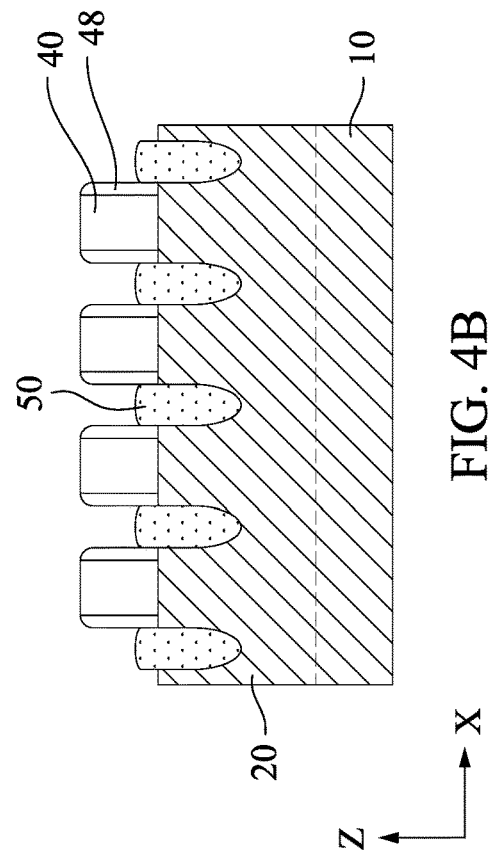

FIGS. 4A-4C show one of the stages of a sequential fabrication process of a semiconductor device according to an embodiment of the present disclosure. FIG. 4A shows a plan (top) view, FIG. 4B shows a cross sectional view along line X1-X1 of FIG. 4A and FIG. 4C shows a cross sectional view along Y2-Y2 of FIG. 4A. In FIG. 4A, the isolation insulating layer 30 is omitted (transparent).

After the source/drain recess 25 is formed, one or more source/drain epitaxial layers 50 are formed in and over the source/drain recess 25. In some embodiments, two or more epitaxial layers having different compositions are formed as the source/drain epitaxial layer 50. In some embodiments, the source/drain epitaxial layer 50 includes SiP or SiCP for an n-type FinFET, and SiGe doped with B for a p-type FinFET. In at least one embodiment, the source/drain epitaxial layers 50 are epitaxially-grown by an LPCVD process, molecular beam epitaxy, atomic layer deposition or any other suitable method. The LPCVD process is performed at a temperature of about 400 to 850° C. and under a pressure of about 1 Torr to 200 Torr, using silicon source gas such as $SiH_4$, $Si_2H_6$, or $Si_3H_8$; germanium source gas such as $GeH_4$, or $G_2H_6$; carbon source gas such as $CH_4$ or $SiH_3CH_3$ and phosphorus source gas such as $PH_3$. In some embodiments, a silicide layer is further formed over the source/drain epitaxial layers 50.

Figure 5A:
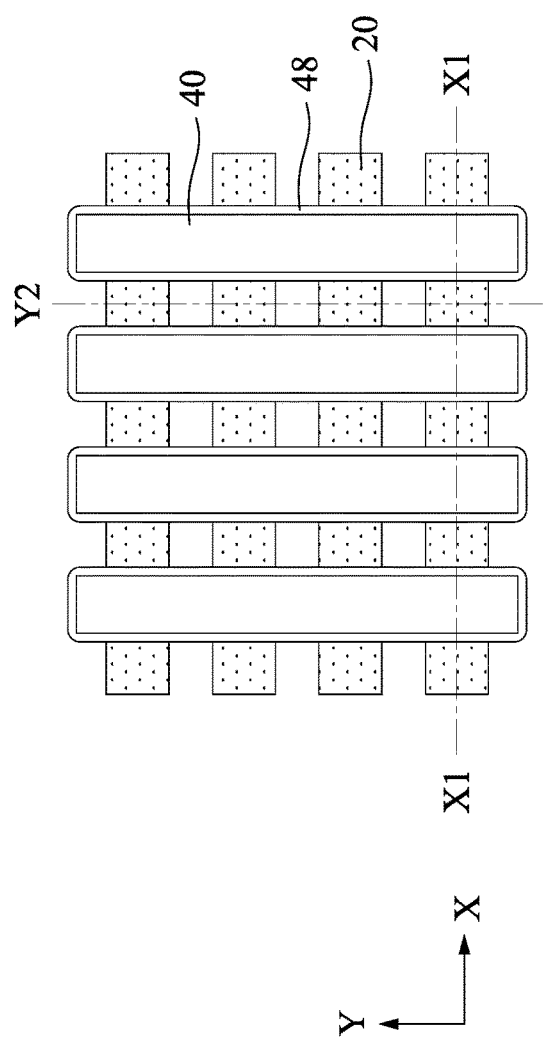
FIGS. 5A, 5B and 5C show a plan view (a top view), a cross sectional view along the X direction and a cross sectional view along the Y direction, respectively, illustrating one of the stages of a sequential semiconductor device fabrication process according to an embodiment of the present disclosure.
Figure 5C:
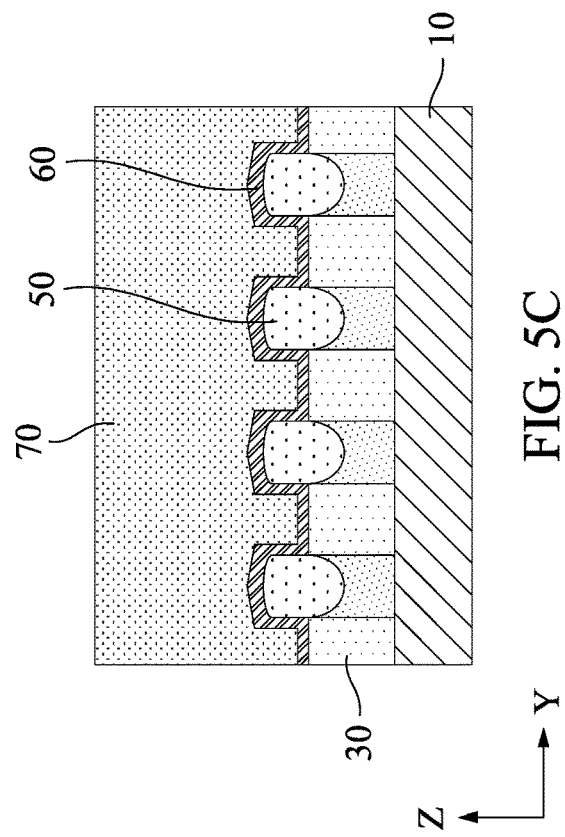
Figure 5B:
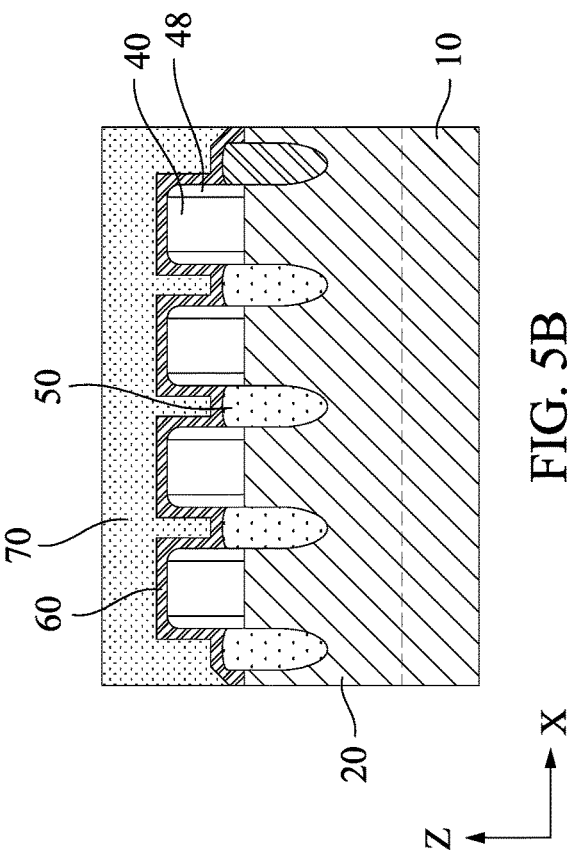

FIGS. 5A-5C show one of the stages of a sequential fabrication process of a semiconductor device according to an embodiment of the present disclosure. FIG. 5A shows a plan (top) view, FIG. 5B shows a cross sectional view along line X1-X1 of FIG. 5A and FIG. 5C shows a cross sectional view along Y2-Y2 of FIG. 5A. In FIG. 5A, some of the layers over the sacrificial gate structures and source/drain epitaxial layers are omitted.

Then, as shown in FIGS. 5A-5C, an etch stop layer 60 is formed over the source/drain epitaxial layer 50 and the dummy gate structures 40, and then a first interlayer dielectric (ILD) layer 70 is formed over the etch stop layer 60. In some embodiments, the etch stop layer 60 is made of a silicon nitride based material, such as silicon nitride or SiON. The materials for the first ILD layer 70 include compounds comprising Si, O, C and/or H, such as silicon oxide, SiCOH and SiOC. Organic materials, such as polymers, may be used for the first ILD layer 70.

FIGS. 6A-6C show one of the stages of a sequential fabrication process of a semiconductor device according to an embodiment of the present disclosure. FIG. 6A shows a plan (top) view, FIG. 6B shows a cross sectional view along line X1-X1 of FIG. 6A and FIG. 6C shows a cross sectional view along Y2-Y2 of FIG. 6A. In FIG. 6A, some of the layers over the sacrificial gate structures and source/drain epitaxial layers are omitted.

After the first ILD layer 70 is formed, a planarization operation, such as CMP, is performed, so that the top portion of the dummy gate structures 40 is exposed. Then, the dummy gate structures 40 including the dummy gate electrode layer and the dummy gate dielectric layer are removed, thereby forming gate spaces. The dummy gate structures can be removed using plasma dry etching and/or wet etching. When the dummy gate electrode layer is polysilicon and the first ILD layer 70 is silicon oxide, a wet etchant such as a TMAH solution can be used to selectively remove the dummy gate electrode layer. The dummy gate dielectric layer is thereafter removed using plasma dry etching and/or wet etching.

In the gate spaces, a metal gate structure is formed. The metal gate structure includes a gate dielectric layer 82 and a metal gate electrode 84 as shown in FIG. 6B. In some embodiments, an interfacial layer is formed on the fin structure 20 and a gate dielectric layer 82 is formed on the interfacial layer. In some embodiments, the interfacial layer is formed by chemical oxidation. In some embodiments, the interfacial layer includes one of silicon oxide, silicon nitride and mixed silicon-germanium oxide. The thickness of the interfacial layer is in a range from about 0.2 nm to about 6 nm in some embodiments. In some embodiments, the gate dielectric layer 82 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$ or other suitable high-k dielectric materials, and/or combinations thereof. The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layer. The thickness of the gate dielectric layer 82 is in a range from about 1 nm to about 100 nm in one embodiment.

The metal gate electrode 84 includes one or more conductive layers disposed on the gate dielectric layer 82. In some embodiments, the metal gate electrode layer includes one or more work function adjustment layers. In some embodiments, the work function adjustment layers are made of a conductive material such as a single layer of TiN, WN, TaAlC, TiC, TaAl, TaC, Co, Al, TiAl, or TiAlC, or a multilayer of two or more of these materials. For the n-channel FET, an aluminum containing layer, such as TiAl, TiAlC, TaAl and/or TaAlC is used as an n-type WFM layer, and for the p-channel FET, one or more of TaN, TiN, WN, TiC and/or Co is used as a p-type WFM layer, in some embodiments. The metal gate electrode layer includes one or more body gate electrode layers formed on the work function adjustment layer. In some embodiments, the body gate electrode layer includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

Figure 7B:
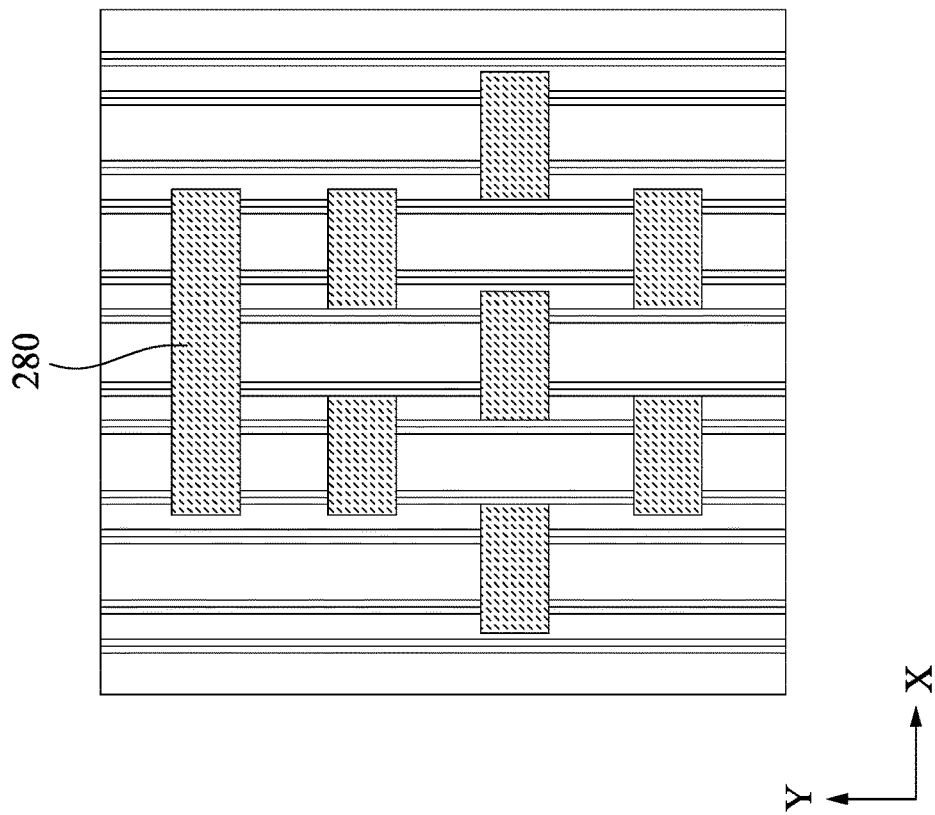
FIGS. 7A and 7B show a perspective view and a plan view (a top view), respectively, illustrating one of the stages of a sequential semiconductor device fabrication process according to an embodiment of the present disclosure.
Figure 7A:
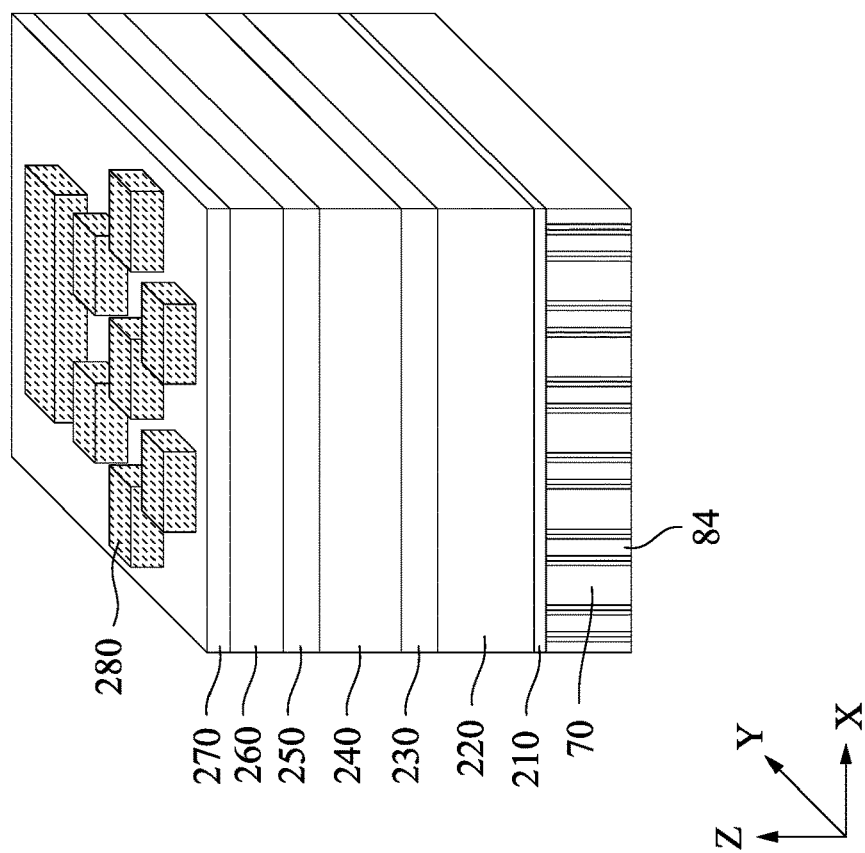

FIGS. 7A and 7B show a perspective view and a plan view (a top view), respectively, illustrating one of the stages of a sequential semiconductor device fabrication process according to an embodiment of the present disclosure.

As shown in FIG. 7A, multiple layers are formed over the gate electrodes 84 and the first ILD layer 70. In some embodiments, a first layer 210 is formed over the gate electrodes 84 and the first ILD layer 70. In some embodiments, the first layer 210 is a dielectric layer such as silicon nitride, SiON, SiCN or SiOCN or other suitable material. In some embodiments, a thickness of the first layer 210 is in a range from about 2 nm to about 4 nm. In some embodiments, the first layer 210 functions as an etch stop layer.

In some embodiments, a second layer 220 is formed over the first layer 210. In some embodiments, the second layer 220 is a dielectric layer different from the first layer 210 and includes silicon oxide, SiOC, SiOCN or other suitable material. In some embodiments, a thickness of the second layer 220 is in a range from about 40 nm to about 80 nm. In some embodiments, the second layer 220 functions as a second ILD layer.

In some embodiments, a third layer 230 is formed over the second layer 220. In some embodiments, the third layer 210 is made of a different material than the second layer 220. In some embodiments, the third layer 230 includes a metal alloy such as WC, WN, TiN, TaN or other suitable material. In other embodiments, the third layer 230 is made of a dielectric material, such as AlO, AlON, AlN, hafnium oxide, or other dielectric material. In some embodiments, a thickness of the third layer 230 is in a range from about 15 nm to about 30 nm. In some embodiments, the third layer 230 functions as a first hard mask layer.

In some embodiments, a fourth layer 240 is formed over the third layer 230. In some embodiments, the fourth layer 240 is a dielectric layer different from the third layer 230 and includes silicon oxide, SiOC, SiOCN or other suitable material. In some embodiments, a thickness of the fourth layer 240 is in a range from about 40 nm to about 50 nm. In some embodiments, the fourth layer 240 functions as a second hard mask layer.

In some embodiments, a fifth layer 250 is formed over the fourth layer 240. In some embodiments, the fifth layer 250 is made of a different material than the fourth layer 240 and includes amorphous silicon or polysilicon, or other suitable material. In other embodiments, the fifth layer 250 is made of a dielectric material, such as AlO, AlON, AlN, hafnium oxide, or other dielectric material. In some embodiments, a thickness of the fifth layer 250 is in a range from about 20 nm to about 40 nm. In some embodiments, the fifth layer 250 functions as a third hard mask layer. The first to fifth layers are formed by CVD, ALD or any suitable method.

Then, as shown in FIG. 7A, a tri-layer resist system is formed over the fifth layer 250. The tri-layer resist system includes a bottom layer 260 as a sixth layer, a middle layer 270 as a seventh layer and a photo resist layer (pattern) 280. In some embodiments, the bottom layer 260 is made of an organic material. The organic material may include a plurality of monomers or polymers that are not cross-linked. The bottom layer 260 contains a material that is patternable and/or have a composition tuned to provide anti-reflection properties in some embodiments. Exemplary materials for the bottom layer 30 include carbon backbone polymers, such as polyhydroxystyrene (PHS), poly methyl methacrylate (PMMA), polyether, and combinations thereof, and other organic polymers containing aromatic rings. In some embodiments, the bottom layer 260 is formed by a spin coating process. In other embodiments, the bottom layer 260 is formed by another suitable deposition process. The thickness of the bottom layer 260 is in a range from about 50 nm to about 100 nm in some embodiments. In some embodiments, after the bottom layer 260 is formed, an annealing operation is performed. The middle layer 270 includes a silicon containing polymer, such as polysiloxane in some embodiments. The thickness of the middle layer 270 is in a range from about 10 nm to about 30 nm in some embodiments. In the tri-layer resist patterning system, the photo resist layer 280 is patterned using one or more lithography operations, as shown FIG. 7A. The photo resist pattern 280 correspond to areas where no source/drain contact layer is formed.

Figure 8B:
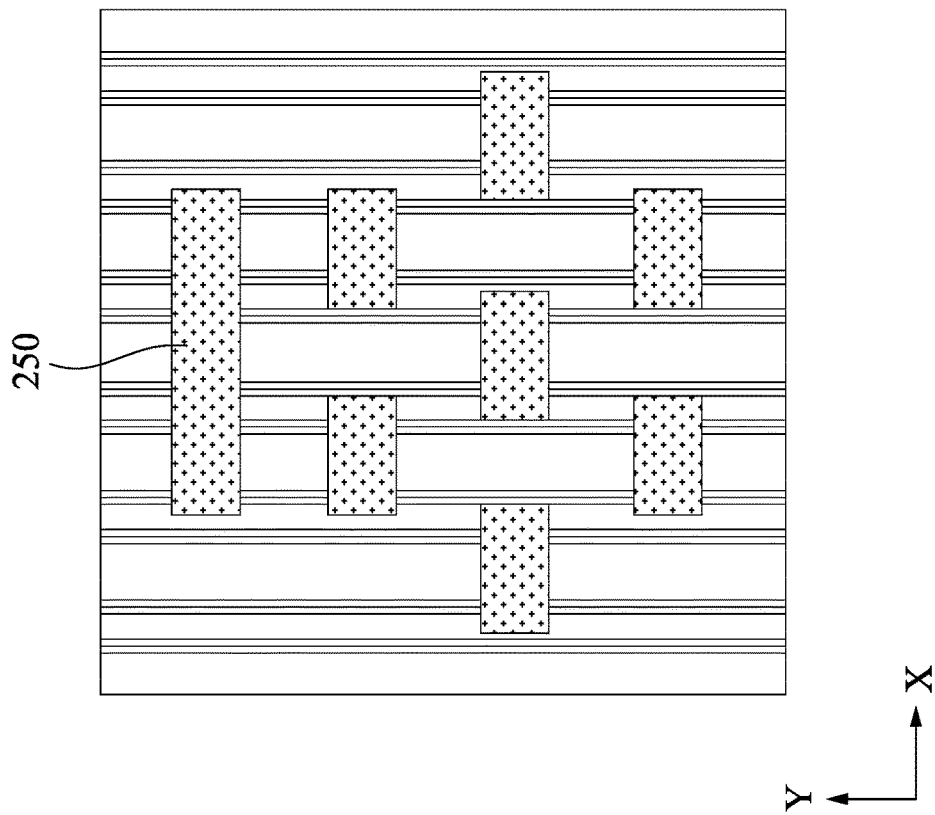
FIGS. 8A and 8B show a perspective view and a plan view (a top view), respectively, illustrating one of the stages of a sequential semiconductor device fabrication process according to an embodiment of the present disclosure.
Figure 8A:
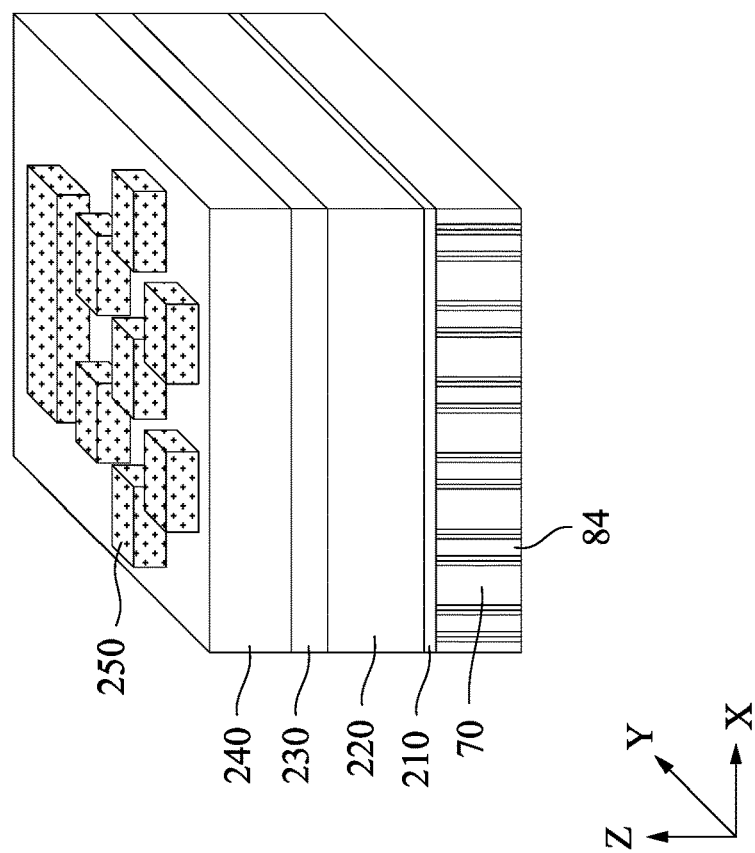

FIGS. 8A and 8B show a perspective view and a plan view (a top view), respectively, illustrating one of the stages of a sequential semiconductor device fabrication process according to an embodiment of the present disclosure.

In some embodiments, the middle layer 270 is etched by using the photo resist pattern 280 as an etching mask, and the bottom layer 260 is etched by using the patterned middle layer as an etching mask. Then, the fifth layer 250 is etched by using the patterned middle layer 270 and/or bottom layer 260 as etching mask, as shown in FIGS. 8A and 8B. In some embodiments, the middle layer 270 and the bottom layer 260 are subsequently removed.

FIGS. 9A and 9B show a perspective view and a plan view (a top view), respectively, illustrating one of the stages of a sequential semiconductor device fabrication process according to an embodiment of the present disclosure.

Then, as shown in FIGS. 9A and 9B, a tri-layer resist system is formed over the patterned fifth layer 250. The tri-layer resist system includes a bottom layer 310, a middle layer 320 and a photo resist layer (pattern) 330. The materials and configurations of the tri-layer resist system are explained as set forth above. The photo resist pattern 330 includes line-and-space patterns extending in the Y direction (gate extending direction).

FIGS. 10A-10D show cross sectional views illustrating various stages of a sequential semiconductor device fabrication process according to an embodiment of the present disclosure.

Figure 10A:
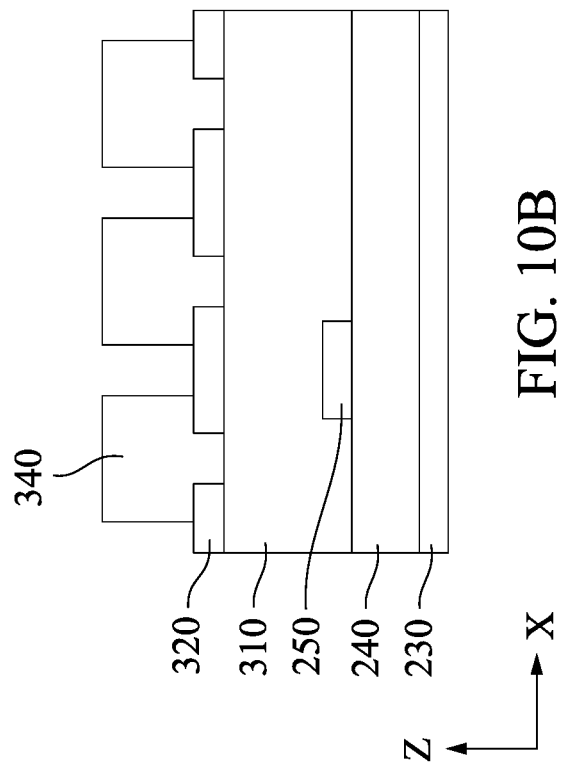
FIGS. 10A, 10B, 10C and 10D show cross sectional views illustrating various stages of a sequential semiconductor device fabrication process according to an embodiment of the present disclosure.
Figure 10B:
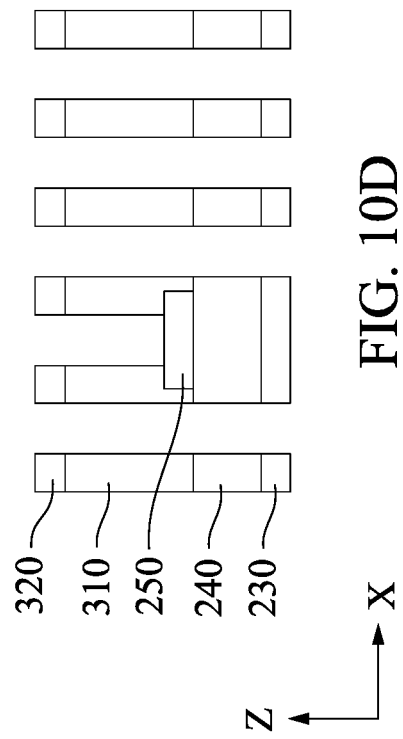

As shown in FIG. 10A, the middle layer 320 is patterned by using the photo resist pattern 330 as an etching mask. Then, in some embodiments, as shown in FIG. 10B, another photo resist pattern having line-and-space patterns is formed over the patterned middle layer 320, and the patterned middle layer 320 is further patterned by using the photo resist pattern 340 as an etching mask. The remaining middle layers 320 disposed above the gate electrode and the spaces formed by the middle layers 320 correspond to the source/drain contact layers.

Figure 11B:
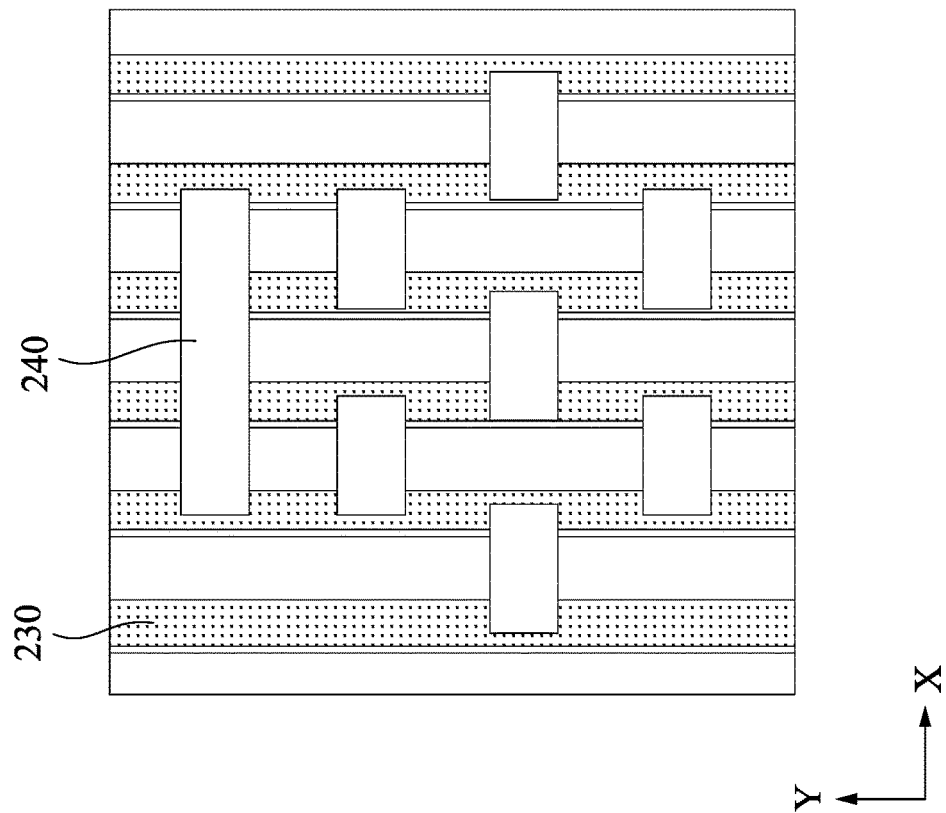
FIGS. 11A and 11B show a perspective view and a plan view (a top view), respectively, illustrating one of the stages of a sequential semiconductor device fabrication process according to an embodiment of the present disclosure.
Figure 11A:
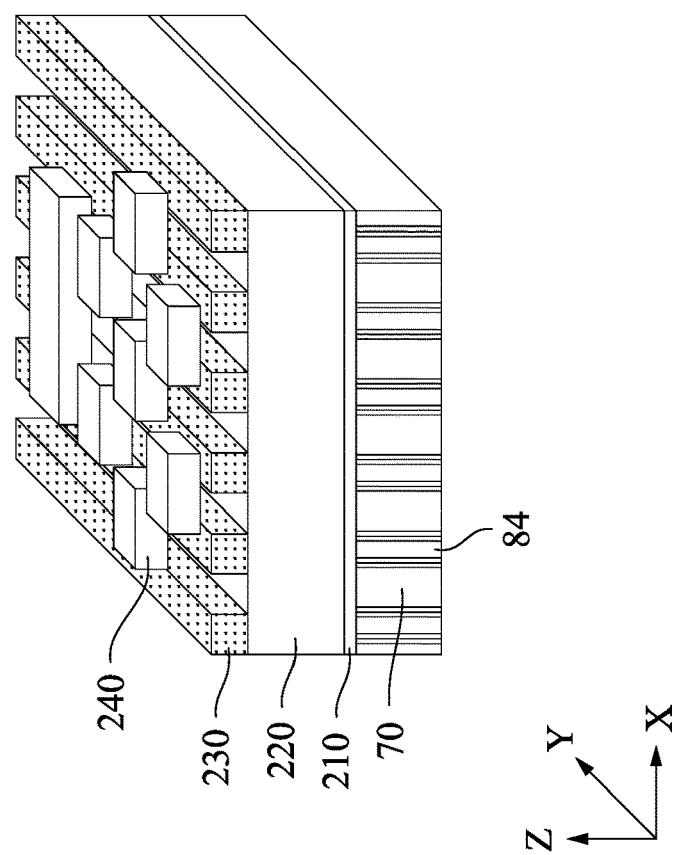

FIGS. 11A and 11B show a perspective view and a plan view (a top view), respectively, illustrating one of the stages of a sequential semiconductor device fabrication process according to an embodiment of the present disclosure.

Figure 10C:
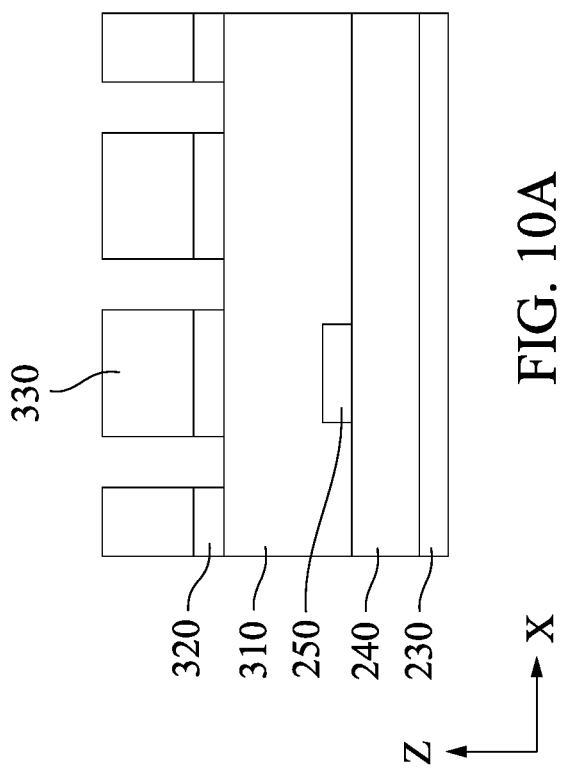
Figure 10D:
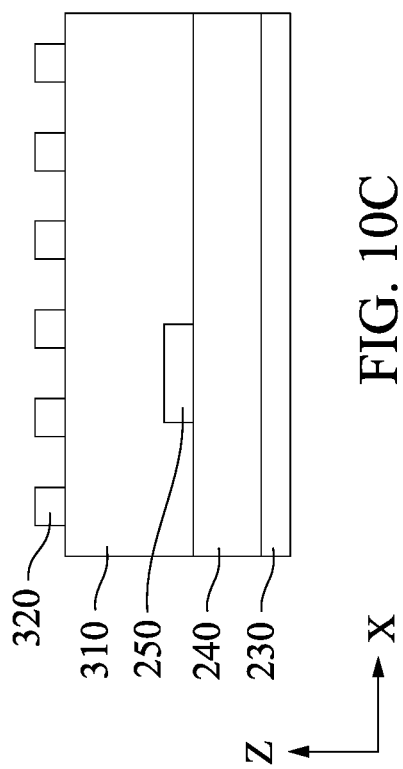

After the middle layer 320 is patterned as shown in FIG. 10C, the bottom layer 310 is patterned by using the patterned middle layer 320 as an etching mask. Then, the fourth layer 240 and the third layer 230 are patterned into line-and-space patterns by using the pattered bottom layer 310 as an etching mask. In this etching operation, the patterned fifth layer 250 having island shapes is not patterned. Accordingly, part of the fourth layer 240 and the third layer 230 under the patterned fifth layer 250 remains as shown in FIG. 10D. In some embodiments, the fifth layer 250, the fourth layer 240 and the third layer 230 are made of different materials from each other.

After the fourth layer 240 and the third layer 230 are patterned, the middle layer 320 and the bottom layer 310 are removed, and the fifth layer 250 is removed, as shown in FIGS. 11A and 11B. The patterned fourth layer 240 corresponds to the photo resist pattern 280, which has been extended to the fifth layer 250. The spaces between the patterned middle layer 320 extend the Y direction, and a portion where no fifth pattern 250 is formed is etched to remove the fourth layer and the third layer, and a portion where the fifth pattern 250 is formed is protected from the etching, thereby leaving the fourth layer and the third layer. As shown in FIG. 11B, the spaces not covered by the patterned third layer 230 and the patterned fourth layer 240 correspond to the source/drain contact layers. In other words, the spaces formed by the patterned third layer 230 are cut by the patterned fourth layer 240.

Figure 12B:
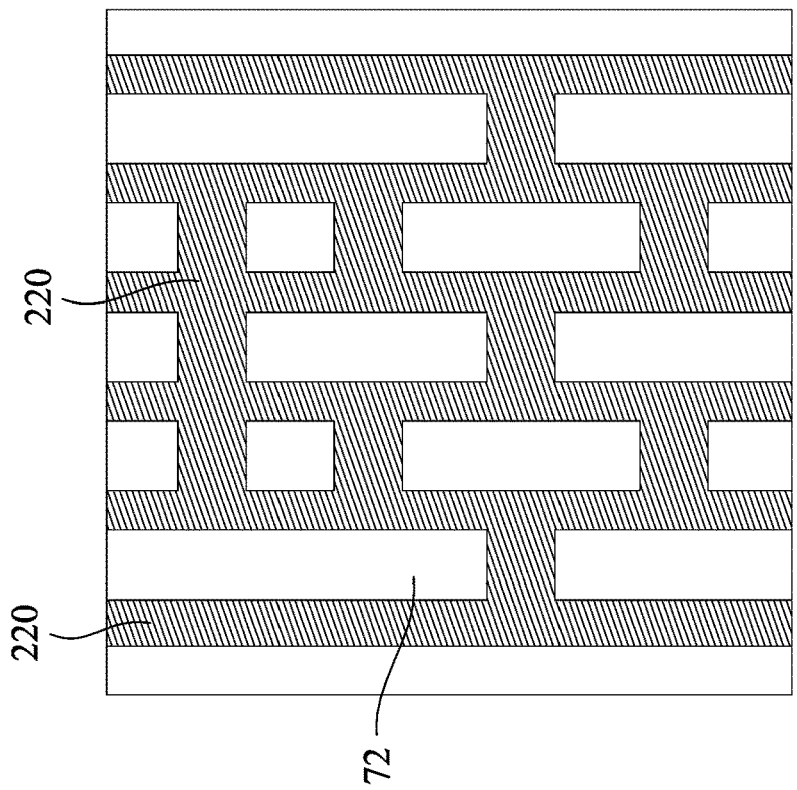
FIGS. 12A and 12B show a perspective view and a plan view (a top view), respectively, illustrating one of the stages of a sequential semiconductor device fabrication process according to an embodiment of the present disclosure.
Figure 12A:
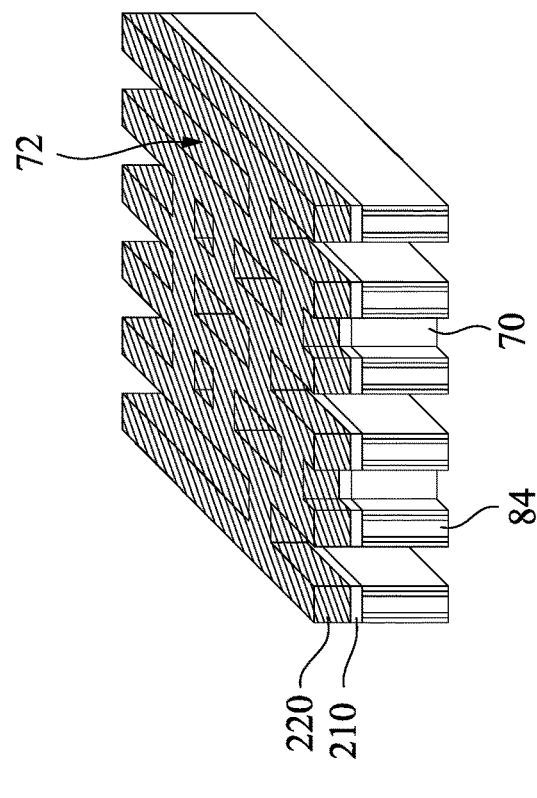

FIGS. 12A and 12B show a perspective view and a plan view (a top view), respectively, illustrating one of the stages of a sequential semiconductor device fabrication process according to an embodiment of the present disclosure.

Subsequently, the second layer 220, the first layer 210 and the first ILD layer 70 are patterned by using the combination of the patterned third layer 230 and the patterned fourth layer 240 as an etching mask, and thereby forming spaces 72. Then, the patterned third layer 230 and the patterned fourth layer 240 are removed, as shown in FIGS. 12A and 12B.

FIGS. 13A, 13B and 13C show a perspective view, a plan view (a top view) and a cross sectional view, respectively, illustrating one of the stages of a sequential semiconductor device fabrication process according to an embodiment of the present disclosure.

The spaces 72 are filled by a conductive material, thereby forming source/drain contact layer 100, as shown in FIGS. 13A-13C. FIG. 13C shows a cross sectional view along the line X2-X2 of FIG. 13A. One or more layers of conductive material, such as tungsten, titanium, cobalt, molybdenum and nickel, or silicide thereof, an alloy thereof or other suitable materials, are formed in the spaces 72 and the second layer 220, and a planarization operation, such as CMP, is performed.

Figure 14:
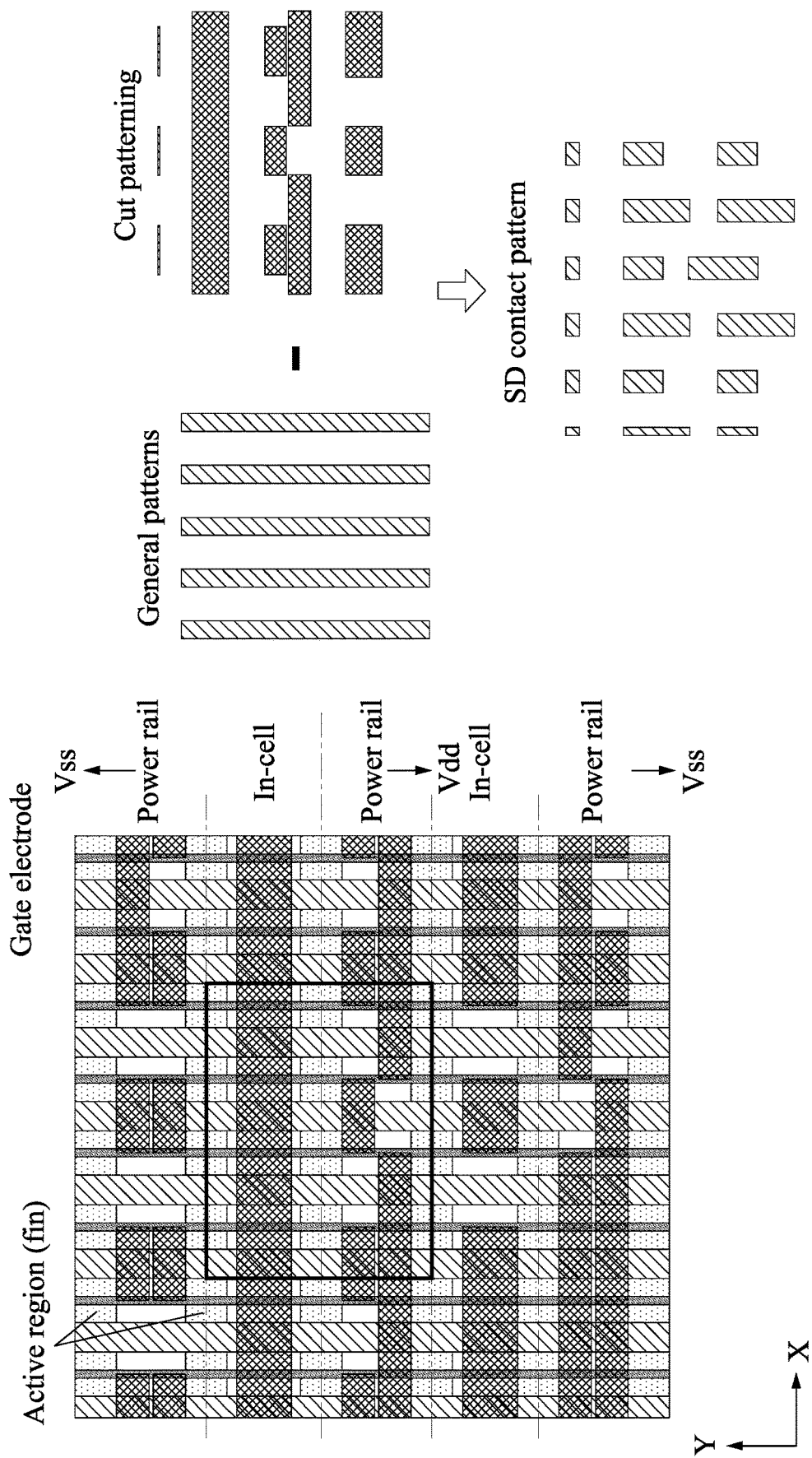
FIG. 14 shows a layout of a stand cell structure of a semiconductor device according to an embodiment of the present disclosure.

FIG. 14 shows an application of the foregoing technique to a standard cell structure of a semiconductor device. In some embodiments, CMOS circuits are disposed in-cell regions between two power rail regions in which power supply wirings for Vdd and Vss are disposed. The gate electrodes extend in the Y direction and are arranged in the X direction, and active regions extend in the X direction and are arranged in the Y direction. In a case of a fin field effect transistor (FinFET), each of the active regions includes one or more fin structures extending in the X direction and arranged in the Y direction. In some embodiments, source/drain contact layers are disposed on and/or connecting source/drain regions of the active regions (fin structures).

As shown in FIG. 14, the pattern of the source/drain contact layer is generated by a subtract operation of general line patterns and cut patterns. The manufacturing operation, as set forth above, achieves this subtract operation.

Figure 15:
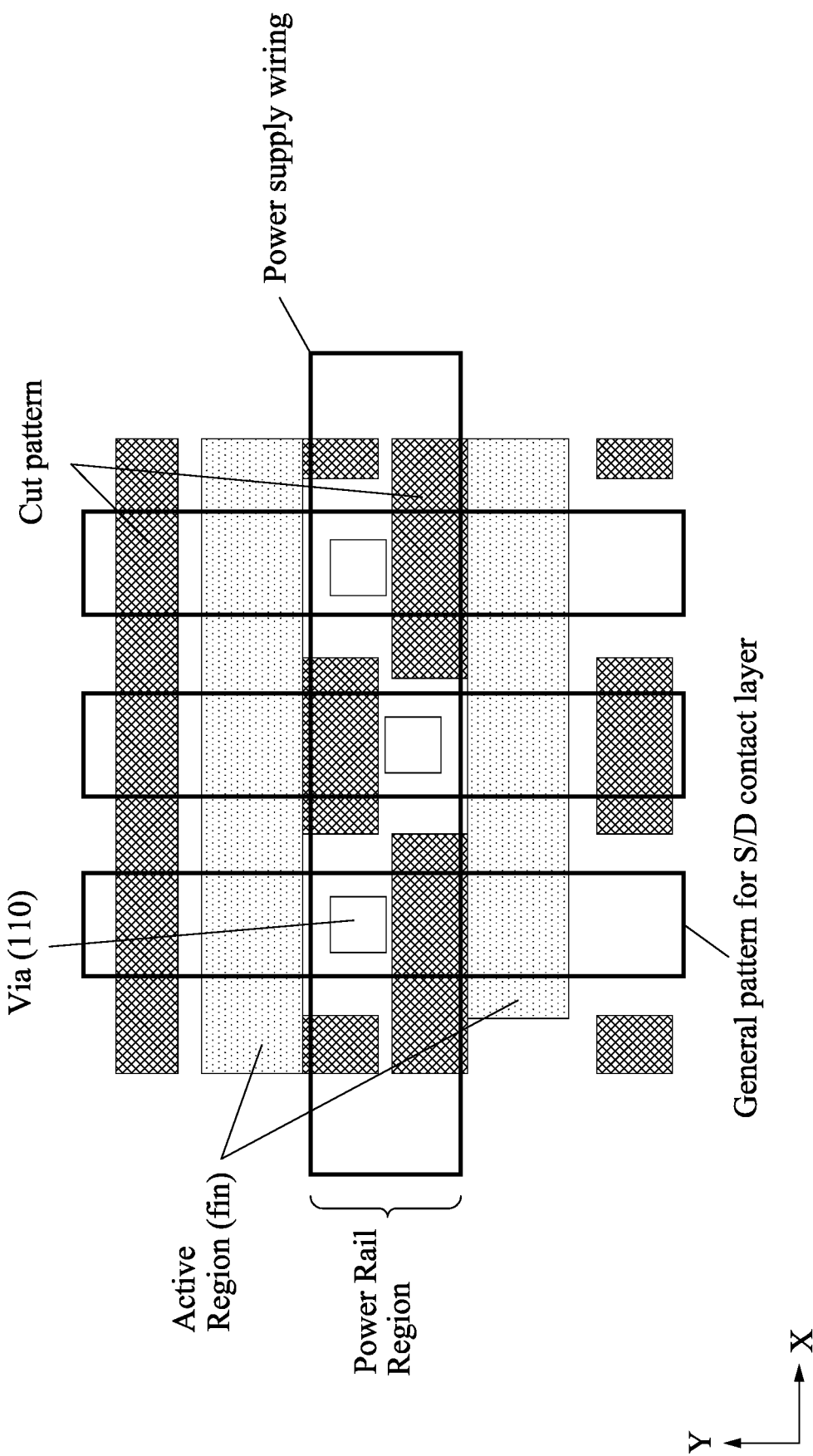
FIG. 15 shows a layout of a power rail region in the stand cell structure of a semiconductor device according to an embodiment of the present disclosure.

FIG. 15 is an enlarged layout view of a power rail region of a standard cell structure according to an embodiment of the disclosure. In some embodiments, one or more vias (110) connect the source/drain contact layers (the remaining general patterns cut by the cut patterns) and the power supply wiring. When the device size shrinks, margins between the vias and the cut patterns and/or margins between adjacent cut patterns decrease. In some embodiments, the adjacent cut patterns merge with each other. In such a case, when the cut patterns are formed as a photo resist pattern 280 as shown in FIG. 7A, a wavy line pattern would be formed. In other cases, island shapes of the cut patterns are rounded in the photo resist patterns. Such deformation of the cut patterns in the photo resist patterns may cause insufficient landing of the vias to the source/drain contact layer. The embodiments disclosed herein solve this problem.

FIGS. 16A-18B show various views illustrating a sequential fabrication process for the source/drain contact layer 100 according to an embodiment of the present disclosure. In these figures, some layers/features are omitted for simplification. It is understood that additional operations can be provided before, during, and after processes shown by these figures, and some of the operations described below can be replaced or eliminated, for additional embodiments of the method. The order of the operations/processes may be interchangeable. Materials, processes, operations, dimensions and/or configurations as explained with respect to FIGS. 1-13C are applied to the following embodiments, and detailed description thereof may be omitted.

Figure 16B:
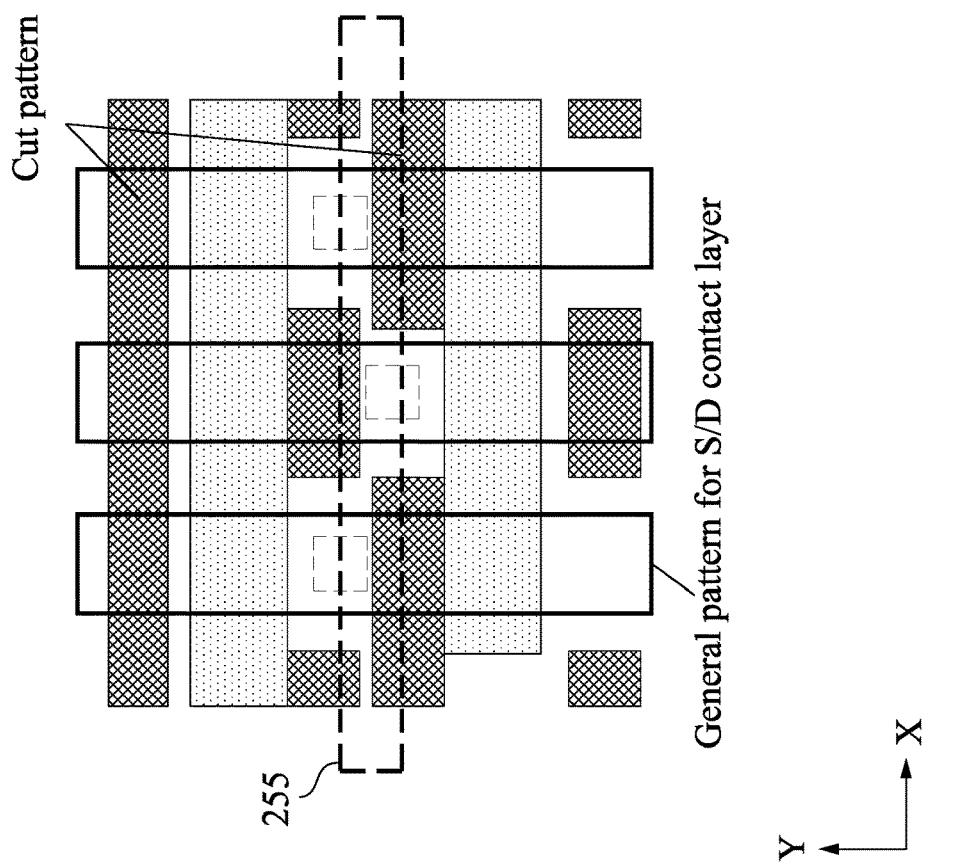
FIGS. 16A and 16B show a perspective view and a layout of the power rail region, respectively, illustrating one of the stages of a sequential semiconductor device fabrication process according to an embodiment of the present disclosure.
Figure 16A:
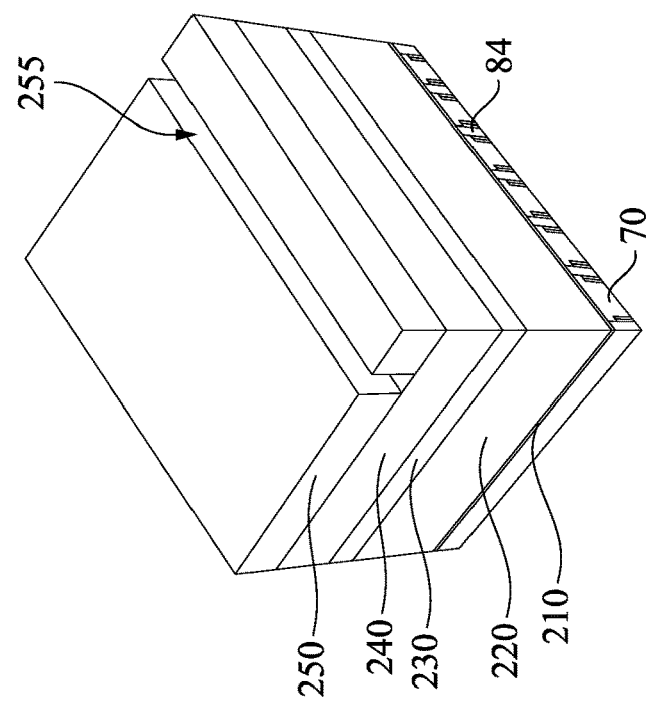

As shown in FIG. 16A, after the fifth layer 250 is formed, the fifth layer 250 is patterned to form a groove 255 by one or more lithography and etching operations. In some embodiments, the groove 255 is located above the power rail region as shown in FIG. 16B. As shown in FIG. 16B, the groove pattern 255 extends in the X direction and overlaps the cut patterns disposed in the power rail region. In some embodiments, the width of the groove pattern 255 in the Y direction is smaller than the distance between adjacent active regions (fins) and greater than a quarter of the distance. In some embodiments, the width of the groove pattern 255 in the Y direction is smaller than the width of the power rail region and greater than a quarter of the width of the power rail region. In some embodiments, the groove pattern 255 is formed without using a tri-layer resist system or a hard mask layer and is formed by directly forming a photo resist pattern on the fifth layer 250 and etching the fifth layer 250 by using an etching operation. In some embodiments, the photo resist pattern includes a bottom antireflective coating layer.

Figure 17B:
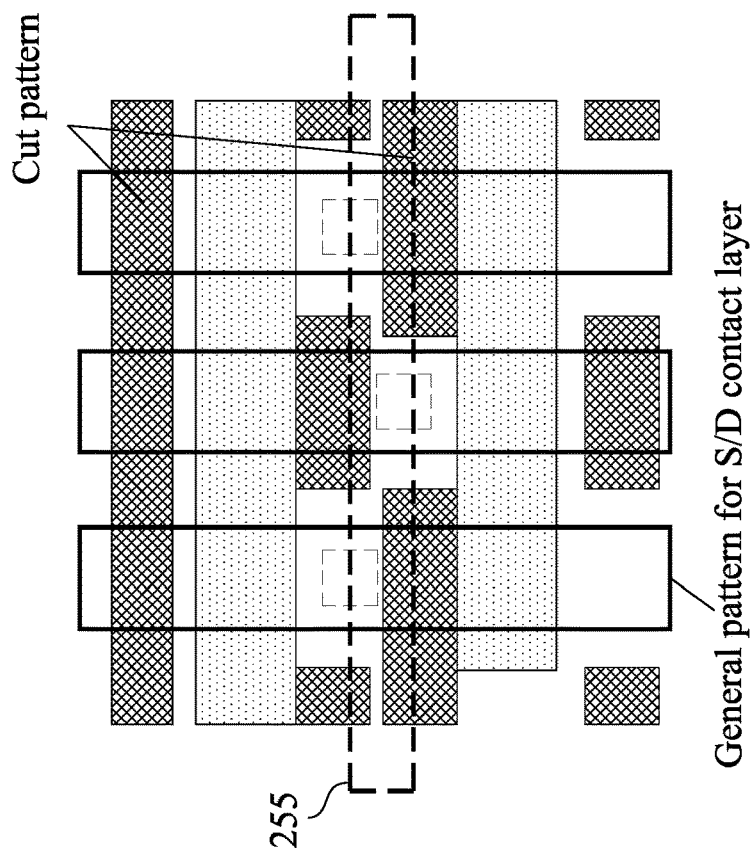
FIGS. 17A and 17B show a perspective view and a layout of the power rail region, respectively, illustrating one of the stages of a sequential semiconductor device fabrication process according to an embodiment of the present disclosure.
Figure 17A:
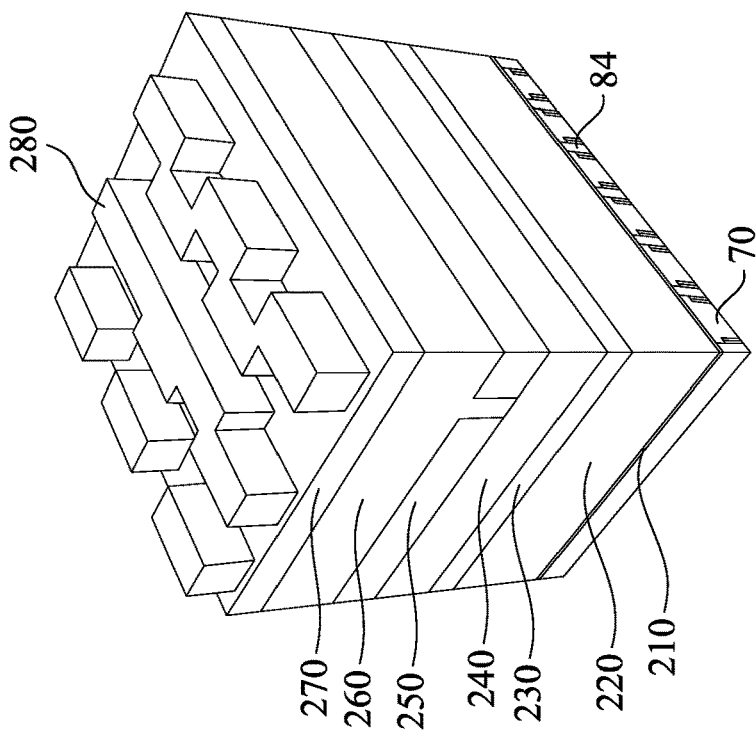

Subsequently, as shown in FIGS. 17A and 17B, a bottom layer 260, a middle layer 270 and a photo resist pattern 280 (tri-layer resist system) are formed over the patterned fifth layer 250. As shown in FIG. 17A, in some embodiments, adjacent island patterns corresponding to the cut pattern merge forming a continuous pattern.

Figure 18B:
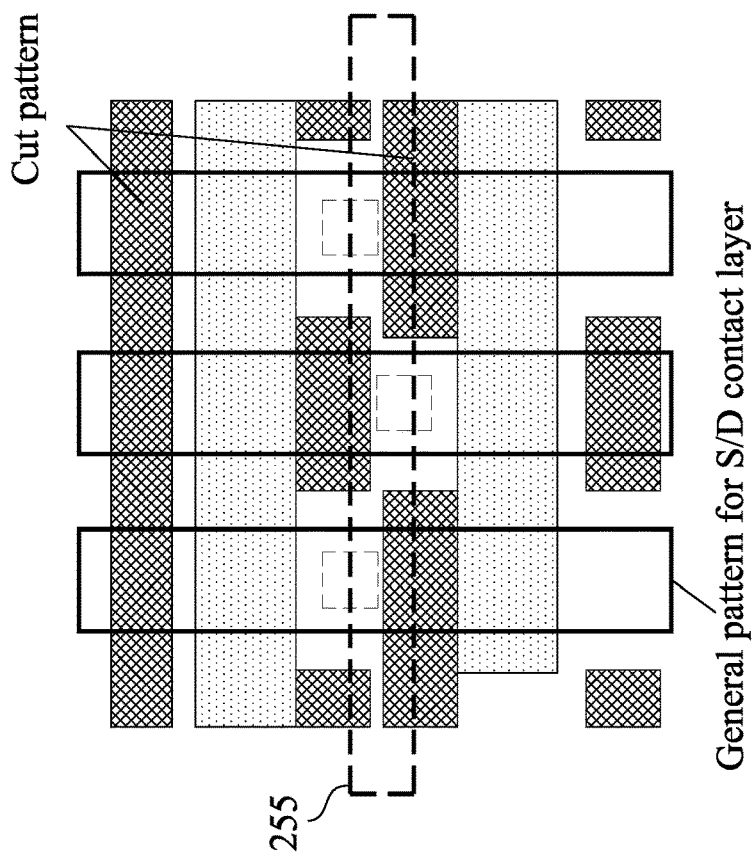
FIGS. 18A and 18B show a perspective view and a layout of the power rail region, respectively, illustrating one of the stages of a sequential semiconductor device fabrication process according to an embodiment of the present disclosure.
Figure 18A:
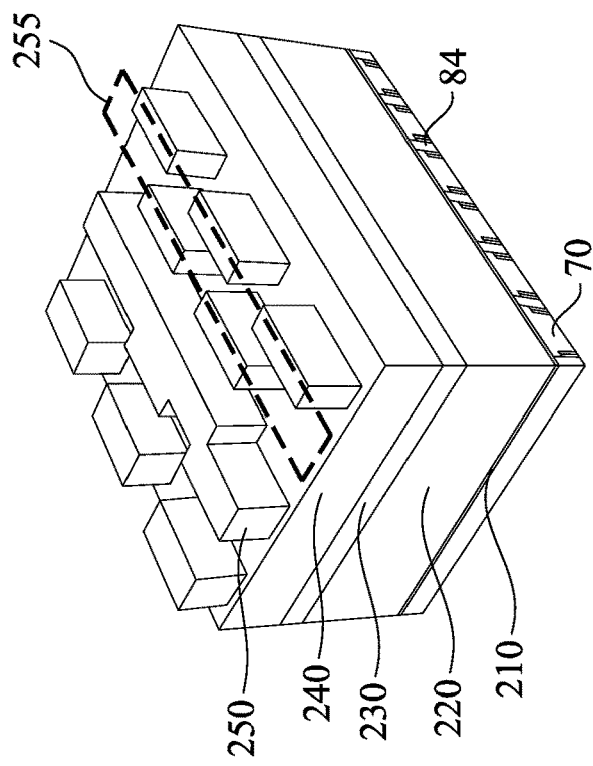

Then, the operations as explained with respect to FIGS. 8A and 8B, the fifth layer 250 is further patterned by using the tri-layer resist systems, as shown in FIG. 18A. Since the groove pattern 255 is pre-fabricated in the fifth layer 250, the merged cut patterns in the photo resist pattern 280 is separated by the groove pattern 255 into island patterns similar to the designed cut patterns as shown in FIG. 18B.

In some embodiments, a groove (trench or opening) pattern can be formed below an area where the photo resist pattern 280 is formed as a continuous pattern or a deformed pattern different from an original layout pattern. The groove pattern 255 can cut or trim the continuous or deformed pattern during the etching of the fifth (hard mask) layer 250.

In other embodiments, groove pattern 255 is not formed, and after the fifth layer 250 is patterned by using the tri-layer resist system with a continuous resist pattern, the continuous pattern of the fifth layer 250 is cut into island patterns by using one or more lithography operations. When the groove pattern 255 is pre-fabricated, since the patterning operation is performed on a relatively flat surface of the fifth layer 250, a process margin increases.

After the fifth layer 250 is patterned, the operation explained with respect to FIGS. 9A-13C are performed to form the source/drain contact layers 100.

The various embodiments or examples described herein offer several advantages over the existing art. For example, in the present disclosure, since a groove pattern is pre-fabricated in a fifth layer (hard mask layer), a deformation in a photo resist pattern is eliminated or suppressed in the hard mask pattern. The technology as disclosed can increase the margin between vias and source/drain contact layers.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device, underlying structures comprising gate electrodes and source/drain epitaxial layers are formed, one or more layers are formed over the underlying structures, a hard mask layer is formed over the one or more layers, a groove pattern is formed in the hard mask layer, one or more first resist layers are formed over the hard mask layer having the groove pattern, a first photo resist pattern is formed over the one or more first resist layers, the one or more first resist layers are patterned by using the first photo resist pattern as an etching mask, thereby forming a first hard mask pattern, and the hard mask layer with the groove pattern are patterned by using the first hard mask pattern, thereby forming a second hard mask pattern. In one or more of the foregoing and the following embodiments, the first photo resist pattern includes a continuous pattern, the first hard mask pattern includes a corresponding continuous pattern, and the corresponding continuous pattern is divided into island patterns by the groove pattern in the second hard mask pattern. In one or more of the foregoing and the following embodiments, the hard mask layer includes amorphous silicon or polysilicon. In one or more of the foregoing and the following embodiments, the groove pattern is located in a power rail region where a power supply wiring is to be formed. In one or more of the foregoing and the following embodiments, a width of the groove pattern is smaller than a width of the power rail regions. In one or more of the foregoing and the following embodiments, the gate electrodes extend in a first direction and arranged in a second direction crossing the first direction, and the groove pattern extends in the second direction over the gate electrodes. In one or more of the foregoing and the following embodiments, one or more second resist layers are formed over the second hard mask pattern, a third hard mask pattern is formed by patterning the one or more second resist layers, and the one or more layers are patterned by using the third hard mask pattern and the second hard mask pattern as an etching mask, thereby forming a fourth hard mask pattern. In one or more of the foregoing and the following embodiments, the underling structure further comprises a first interlayer dielectric (ILD) layer disposed over the source/drain epitaxial layers and a second ILD layer disposed over the first ILD layer and gate electrodes. The second ILD layer and the first ILD layer are patterned by using the fourth hard mask pattern as an etching mask, thereby forming trench patterns, and source/drain contact patterns are formed by filling the trench patterns with a conductive material.

In accordance with another aspect of the present disclosure, in a method of manufacturing a semiconductor device, an underlying structure is formed. The underlying structure includes fin structures disposed over a substrate, gate structures disposed over upper portions of the fin structures, source/drain epitaxial layers over source/drain regions of the fin structures, and an interlayer dielectric (ILD) layer over the source/drain epitaxial layer. A first layer is formed over the underlying structure, a second layer is formed over the first layer, a third layer is formed over the second layer, a fourth layer is formed over the third layer, and a fifth layer is formed over the fourth layer. A groove pattern is formed in the fifth layer, a first resist layer is formed over the fifth layer having the groove pattern, the first resist layer is patterned by using a first photo resist pattern as an etching mask, and the fifth layer is patterned by using the patterned first resist layer as an etching mask. A second resist layer is formed over the patterned fifth layer, the second resist layer is patterned by using one or more second photo resist patterns as an etching mask, the fourth and third layers are patterned by using the patterned second resist layer and the patterned fifth layer as an etching mask, the second layer, the first layer and the ILD layer are patterned by using the patterned fourth and third layers as an etching mask, thereby forming trench patterns over the source/drain epitaxial layers, and source/drain contact patterns are formed by filling the trench patterns with a conductive material. In one or more of the foregoing and the following embodiments, the fifth layer includes amorphous silicon or polysilicon. In one or more of the foregoing and the following embodiments, the third layer includes at least one of WC, WN, TiN or TaN. In one or more of the foregoing and the following embodiments, at least one of the second layer or the fourth layer includes silicon oxide. In one or more of the foregoing and the following embodiments, the second layer includes silicon nitride. In one or more of the foregoing and the following embodiments, each of the first and second resist layer includes a bottom layer includes an organic material and a middle layer includes silicon containing polymer. In one or more of the foregoing and the following embodiments, the patterned second resist layer includes line patterns disposed above the gate structures and spaces disposed above the source/drain epitaxial layers. In one or more of the foregoing and the following embodiments, the gate structures extend in a first direction and arranged in a second direction crossing the first direction, and the groove pattern extends in the second direction over the gate structures.

In accordance with another aspect of the present disclosure, in a method of manufacturing a semiconductor device, an underlying structure is formed, a dielectric layer is formed over the underlying structure, a first hard mask layer is formed over the dielectric layer, a second hard mask layer is formed over the first hard mask layer, first hard mask patterns are formed over the second hard mask layer, a resist layer is formed over the first hard mask patterns, second hard mask patterns are formed by patterning the resist layer, and the second hard mask layer and the first hard mask layer are patterned by using the first hard mask pattern and the second hard mask patterns as an etching mask. The patterned second hard mask layer comprises patterns corresponding to the first hard mask patterns, and the patterned first hard mask layer comprises patterns corresponding to the second hard mask patterns. In one or more of the foregoing and the following embodiments, the first hard mask layer, the second hard mask layer and the first hard mask patterns are made of different material from each other. In one or more of the foregoing and the following embodiments, the dielectric layer is patterned by using the patterned second hard mask layer and the patterned first hard mask layer as an etching mask. In one or more of the foregoing and the following embodiments, after the dielectric layer is patterned, the patterned second hard mask layer and the patterned first hard mask layer are removed.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming underlying structures comprising gate electrodes and source/drain epitaxial layers over a substrate;
   forming one or more layers over the underlying structures;
   forming a hard mask layer over the one or more layers;
   forming a groove pattern in the hard mask layer;
   forming one or more first resist layers over the hard mask layer having the groove pattern;
   forming a first photo resist pattern over the one or more first resist layers;
   patterning the one or more first resist layers by using the first photo resist pattern as an etching mask, thereby forming a first hard mask pattern; and
   patterning the hard mask layer with the groove pattern by using the first hard mask pattern, thereby forming a second hard mask pattern,
   wherein:
   the first photo resist pattern includes a continuous pattern, and the first hard mask pattern includes a corresponding continuous pattern, and
   the corresponding continuous pattern is divided into island patterns by the groove pattern in the second hard mask pattern.

2. The method of claim 1, wherein the hard mask layer includes amorphous silicon or polysilicon.

3. The method of claim 1, wherein the groove pattern is located in a power rail region where a power supply wiring is to be formed.

4. The method of claim 3, wherein a width of the groove pattern is smaller than a width of the power rail regions.

5. The method of claim 1, wherein:
   the gate electrodes extend in a first direction and are arranged in a second direction crossing the first direction, and
   the groove pattern extends in the second direction over the gate electrodes.

6. The method of claim 1, further comprising
   forming one or more second resist layers over the second hard mask pattern;
   forming a third hard mask pattern by patterning the one or more second resist layers; and
   patterning the one or more layers by using the third hard mask pattern and the second hard mask pattern as an etching mask, thereby forming a fourth hard mask pattern.

7. The method of claim 6, wherein:
   the underling structure further comprises a first interlayer dielectric (ILD) layer disposed over the source/drain epitaxial layers and a second ILD layer disposed over the first ILD layer and gate electrodes, and the method further comprises:

patterning the second ILD layer and the first ILD layer by using the fourth hard mask pattern as an etching mask, thereby forming trench patterns; and forming source/drain contact patterns by filling the trench patterns with a conductive material.

8. The method of claim 1, wherein:

the hard mask layer comprises at least one compound selected from the group consisting of silicon oxide, amorphous silicon, polysilicon, SiOC, SiOCN, WC, WN, TiN, TaN, AlO, AlON, AlN, and hafnium oxide.

9. A method of manufacturing a semiconductor device, the method comprising:

forming an underlying structure comprising fin structures disposed over a substrate, gate structures disposed over upper portions of the fin structures, source/drain epitaxial layers over source/drain regions of the fin structures, and an interlayer dielectric (ILD) layer over the source/drain epitaxial layer;

forming a first layer over the underlying structure;

forming a second layer over the first layer;

forming a third layer over the second layer;

forming a fourth layer over the third layer;

forming a fifth layer over the fourth layer;

forming a groove pattern in the fifth layer;

forming a first resist layer over the fifth layer having the groove pattern;

patterning the first resist layer by using a first photo resist pattern as an etching mask;

patterning the fifth layer by using the patterned first resist layer as an etching mask;

forming a second resist layer over the patterned fifth layer;

patterning the second resist layer by using one or more second photo resist patterns as an etching mask;

patterning the fourth and third layers by using the patterned second resist layer and the patterned fifth layer as an etching mask;

patterning the second layer, the first layer and the ILD layer by using the patterned fourth and third layers as an etching mask, thereby forming trench patterns over the source/drain epitaxial layers; and forming source/drain contact patterns by filling the trench patterns with a conductive material.

10. The method of claim 9, wherein the fifth layer includes amorphous silicon or polysilicon.

11. The method of claim 9, wherein the third layer includes at least one of WC, WN, TiN or TaN.

12. The method of claim 9, wherein at least one of the second layer or the fourth layer includes silicon oxide.

13. The method of claim 9, wherein the second layer includes silicon nitride.

14. The method of claim 9, wherein each of the first and second resist layer includes a bottom layer including an organic material and a middle layer including a silicon containing polymer.

15. The method of claim 9, wherein the patterned second resist layer includes line patterns disposed above the gate structures and spaces disposed above the source/drain epitaxial layers.

16. The method of claim 9, wherein:

the gate structures extend in a first direction and are arranged in a second direction crossing the first direction, and the groove pattern extends in the second direction over the gate structures.

17. A method of manufacturing a semiconductor device, the method comprising:

forming an underlying structure;

forming a dielectric layer over the underlying structure;

forming a first hard mask layer over the dielectric layer;

forming a second hard mask layer over the first hard mask layer, the second hard mask layer comprised of at least one compound selected from the group consisting of silicon oxide, amorphous silicon, polysilicon, SiOC, SiOCN, AlO, AlON, AlN, and hafnium oxide;

forming first hard mask patterns over the second hard mask layer;

forming a resist layer over the first hard mask patterns;

forming second hard mask patterns by patterning the resist layer; and patterning the second hard mask layer and the first hard mask layer by using the first hard mask pattern and the second hard mask patterns as an etching mask, wherein the patterned second hard mask layer comprises patterns corresponding to the first hard mask patterns, and the patterned first hard mask layer comprises patterns corresponding to the second hard mask patterns.

18. The method of claim 17, wherein the first hard mask layer, the second hard mask layer and the first hard mask patterns are made of different material from each other.

19. The method of claim 17, further comprising, patterning the dielectric layer by using the patterned second hard mask layer and the patterned first hard mask layer as an etching mask.

20. The method of claim 18, further comprising after the dielectric layer is patterned, removing the patterned second hard mask layer and the patterned first hard mask layer.

* * * * *